(12) United States Patent
Wang et al.

(10) Patent No.: US 11,658,257 B2
(45) Date of Patent: May 23, 2023

(54) LIGHT SOURCE ASSEMBLY, OPTICAL SENSOR ASSEMBLY, AND METHOD OF MANUFACTURING A CELL OF THE SAME

(71) Applicant: HARVATEK CORPORATION, Hsinchu (TW)

(72) Inventors: Mam-Tsung Wang, Hsinchu (TW); Shyi-Ming Pan, Hsinchu (TW); Ping-Lung Wang, Hsinchu (TW)

(73) Assignee: HARVATEK CORPORATION, Hsinchu (TW)

( * ) Notice: Subject to any disclaimer, the term of this patent is extended or adjusted under 35 U.S.C. 154(b) by 0 days.

(21) Appl. No.: 17/005,343

(22) Filed: Aug. 28, 2020

(65) Prior Publication Data

US 2021/0305449 A1    Sep. 30, 2021

Related U.S. Application Data

(63) Continuation-in-part of application No. 16/831,840, filed on Mar. 27, 2020, now Pat. No. 11,322,542.

(51) Int. Cl.
| | |
|---|---|
| *H01L 31/173* | (2006.01) |
| *H01L 31/02* | (2006.01) |
| *H01L 31/0232* | (2014.01) |
| *H01L 31/0304* | (2006.01) |
| *H01L 31/18* | (2006.01) |

(Continued)

(52) U.S. Cl.
CPC ............ *H01L 31/173* (2013.01); *H01L 29/16* (2013.01); *H01L 29/78* (2013.01); *H01L 31/02019* (2013.01); *H01L 31/02327* (2013.01); *H01L 31/03044* (2013.01); *H01L 31/1852* (2013.01); *H01L 31/1856* (2013.01);

(Continued)

(58) Field of Classification Search
CPC .............. H01L 31/173; H01L 31/1856; H01L 31/03044; H01L 31/1852; H01L 31/02327; H01L 31/02019; H01L 33/32; H01L 33/60; H01L 33/007; H01L 2933/0058

See application file for complete search history.

(56) References Cited

U.S. PATENT DOCUMENTS

| | | | | |
|---|---|---|---|---|
| 5,753,928 | A | * | 5/1998 | Krause ................... H01L 31/173 250/214.1 |
| 2008/0273566 | A1 | * | 11/2008 | Nishinaka ............... H01L 33/32 438/47 |

(Continued)

FOREIGN PATENT DOCUMENTS

| | | | | |
|---|---|---|---|---|
| CN | 103390681 A | * | 11/2013 | ........... H01L 31/173 |
| CN | 105552159 A | | 5/2016 | |

(Continued)

OTHER PUBLICATIONS

B. Shi, Y. Han, Q. Li and K. M. Lau, "1.55-μm Lasers Epitaxially Grown on Silicon," in IEEE Journal of Selected Topics in Quantum Electronics, vol. 25, No. 6, pp. 1-11, Nov.-Dec. 2019, Art No. 1900711, doi: 10.1109/JSTQE.2019.2927579. (Year: 2019).*

*Primary Examiner* — Sitaramarao S Yechuri
(74) *Attorney, Agent, or Firm* — ScienBiziP, P.C.

(57) ABSTRACT

A light source assembly includes a plurality of cells and a driving circuit. Each of the cells includes a transistor and a light source. The transistor includes a drain region that serves as a cathode of the light source. The driving circuit is configured to drive the cell. An optical sensor cell and a method for manufacturing thereof are also disclosed.

16 Claims, 35 Drawing Sheets

(51) Int. Cl.
  *H01L 33/00*  (2010.01)
  *H01L 33/32*  (2010.01)
  *H01L 33/60*  (2010.01)
  *H01L 29/16*  (2006.01)
  *H01L 29/78*  (2006.01)
(52) U.S. Cl.
  CPC ............ *H01L 33/007* (2013.01); *H01L 33/32* (2013.01); *H01L 33/60* (2013.01); *H01L 2933/0058* (2013.01)

(56) References Cited

U.S. PATENT DOCUMENTS

| | | | | |
|---|---|---|---|---|
| 2013/0299841 A1* | 11/2013 | Ranglack | .............. | H01L 25/167 257/E33.025 |
| 2016/0005896 A1* | 1/2016 | Lahav | ............. | H01L 31/035272 257/292 |
| 2016/0308085 A1* | 10/2016 | Guter | ...................... | H01L 33/20 |
| 2017/0318632 A1* | 11/2017 | Simin | ..................... | H01L 27/15 |
| 2019/0114970 A1* | 4/2019 | Moradi | .................... | H01L 27/32 |
| 2020/0035843 A1* | 1/2020 | Zhao | ............. | H01L 31/035236 |
| 2020/0066786 A1* | 2/2020 | Hartensveld | ............ | H01L 27/15 |
| 2020/0066849 A1 | 2/2020 | Then et al. | | |
| 2020/0321390 A1* | 10/2020 | Wu | ......................... | H01L 33/50 |

FOREIGN PATENT DOCUMENTS

| | | | | |
|---|---|---|---|---|
| CN | 109904303 A | * | 6/2019 | ........... H01L 33/507 |
| JP | H05-067769 A | | 3/1993 | |
| KR | 101352437 B1 | | 1/2014 | |
| TW | 200822358 A | | 5/2008 | |
| TW | 201106485 A | | 2/2011 | |
| TW | 201725747 A | | 7/2017 | |
| WO | WO-2017093678 A1 | * | 6/2017 | ............. H01L 27/15 |

\* cited by examiner

LIGHT SOURCE ASSEMBLY, OPTICAL SENSOR ASSEMBLY, AND METHOD OF MANUFACTURING A CELL OF THE SAME

CROSS REFERENCE TO RELATED APPLICATION

This application is a continuation-in-part of U.S. patent application Ser. No. 16/831,840, filed Mar. 27, 2020, which is incorporated herein by reference in its entirety.

BACKGROUND

A light-emitting diode (LED) assembly includes a plurality of LED cells and a driving circuit. Each of the LED cells includes an LED and a transistor. The LED includes a p-type semiconductor layer, a p-type LED electrode (or an anode terminal) connected to the p-type semiconductor layer, an n-type semiconductor layer, and an n-type LED electrode (or a cathode terminal) connected to the n-type semiconductor layer. The driving circuit is configured to drive the LED cells, e.g., to control the on-off state and the brightness of the LED.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
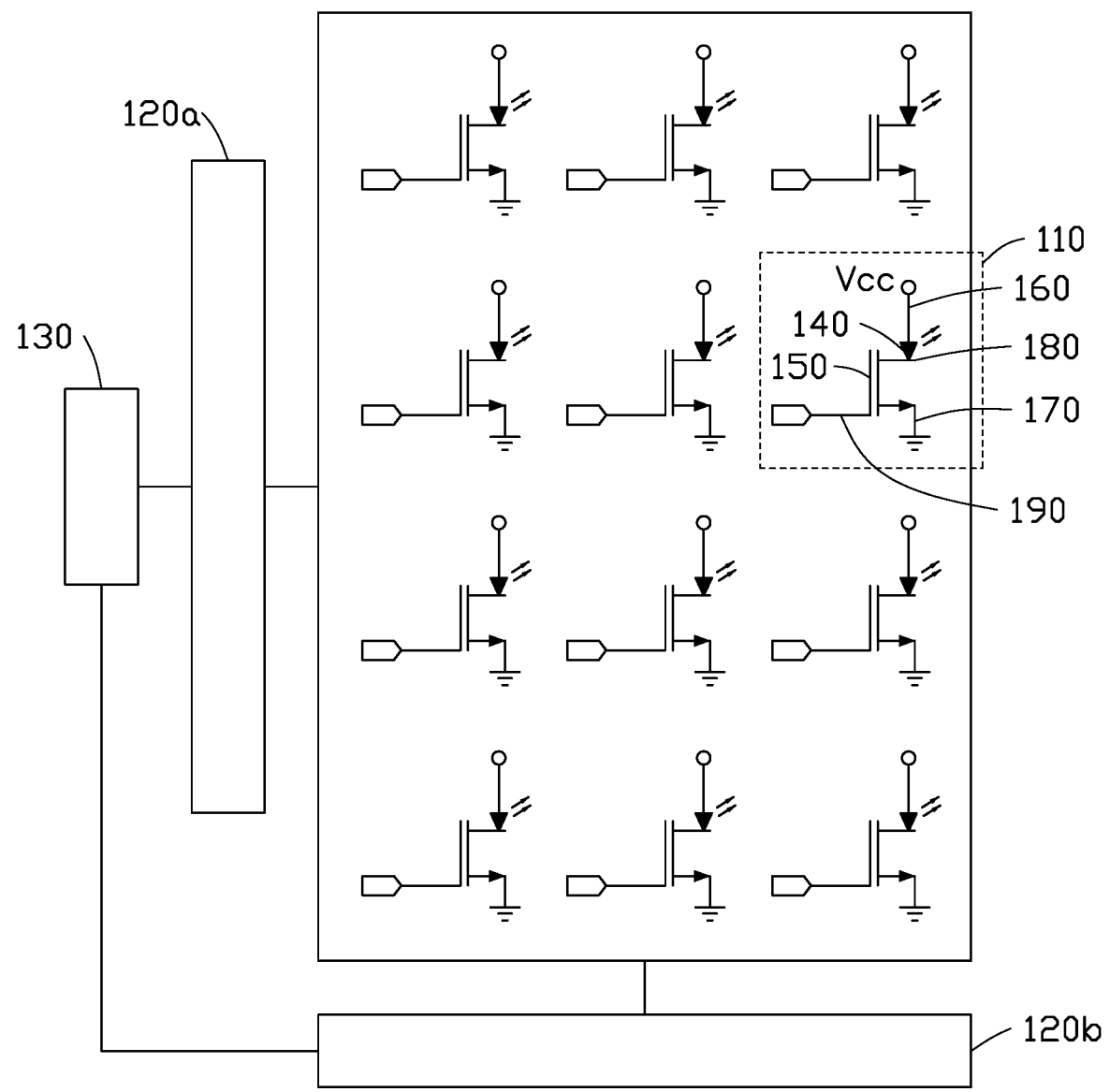
FIG. 1 is a schematic diagram illustrating an exemplary light-emitting diode (LED) assembly according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Systems and methods as described herein comprises a light-emitting diode (LED) assembly, e.g., LED assembly 100 in FIG. 1, that includes an LED cell, e.g., LED cell 110. The LED cell 110 includes an LED, e.g., LED 140, and a transistor, e.g., transistor 150. In an embodiment, the transistor 150 includes a drain terminal (e.g., drain terminal 180), that serves as a cathode terminal or an n-type LED electrode of the LED 140. Thus, in such an embodiment, the LED 140 is free of a cathode terminal or an n-type LED electrode. FIG. 1 is a schematic diagram illustrating an exemplary LED assembly 100 in accordance with some embodiments of the present disclosure.

In further detail, the example of FIG. 1 comprises a plurality of LED cells, e.g., LED cell 110, a row decoder 120a, a column decoder 120b, and a driving circuit 130. As shown in FIG. 1, the LED cells are arranged in array of rows and columns. Since the LED cells are similar in structure and operation, only the LED cell 110 will be described hereinbelow. The LED cell 110 includes an LED 140 and a transistor 150. The LED 140 includes an anode terminal 160 or a p-type LED electrode configured to receive a supply voltage (Vcc).

The transistor 150 includes a source terminal 170 configured to receive a reference voltage, e.g., 0V, less than the supply voltage (Vcc). In an embodiment, the transistor 150 further includes a drain terminal 180 that serves as a cathode terminal or an n-type LED electrode of the LED 140. Thus, in such an embodiment, the LED 140 is free of a cathode terminal or an n-type LED electrode.

The row and column decoders 120a, 120b are connected to the LED cells and are configured to select one of the LED cells, e.g., LED cell 110. The driving circuit 130 is connected to the row and column decoders 120a, 120b and is configured to drive, i.e., control the on/off state and the brightness of the LED 140 of the LED cell 110 selected by the row and column decoders 120a, 120b.

In an exemplary operation of the LED assembly 100, at an initial state, a gate voltage (Vg), e.g., 0V, is applied to a gate terminal 190 of the transistor 150. This turns the transistor 150 off, disconnecting the drain terminal 180 of the transistor 150 from, e.g., the ground. As a result, the LED 140 is turned off. When it is desired to turn on the LED 140, a gate voltage (Vg), e.g., substantially equal to the supply voltage (Vcc) at the anode terminal 160 or the p-type LED electrode of the LED 140, is applied to the gate terminal 190 of the transistor 150. This turns the transistor 150 on, connecting the drain terminal 180 of the transistor 150 to the ground. As a result, the LED 140 is turned on, whereby the LED 140 emits light.

Figure 2:
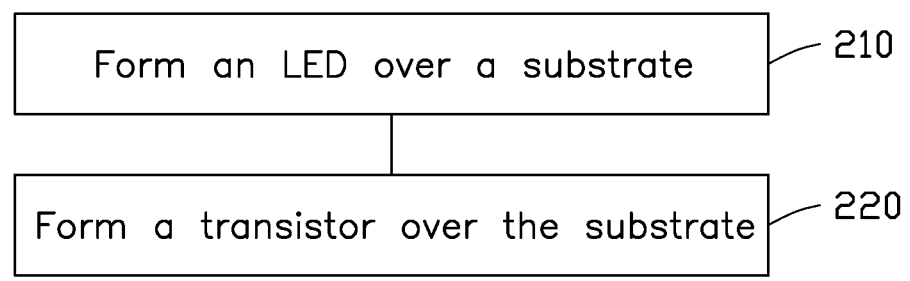
FIG. 2 is a flowchart illustrating an exemplary method of manufacturing an LED cell of the LED assembly according to some embodiments of the present disclosure.

FIG. 2 is a flowchart illustrating an exemplary method 200 of manufacturing an LED cell, e.g., LED cell 110 in FIG. 1, of an LED assembly, e.g., LED assembly 100, according to some embodiments of the present disclosure. The method 200 begins with block 210 in which an LED, e.g., LED 140, of the LED cell 110 is formed over a substrate. The method 200 continues with block 220 in which a transistor, e.g., transistor 150, of the LED cell 110 is formed over the substrate. As will be described below, in an embodiment, the transistor 150 includes a drain terminal 180 that serves as a cathode terminal or an n-type LED electrode of the LED 140. Thus, in such an embodiment, the LED 140 is free of a cathode terminal or an n-type LED electrode.

FIGS. 3-28 are schematic sectional views illustrating various stages of the manufacturing of an LED cell, e.g., LED cell 110 in FIG. 1, of an LED assembly, e.g., LED assembly 100, according to some embodiments of the present disclosure.

Figure 3:
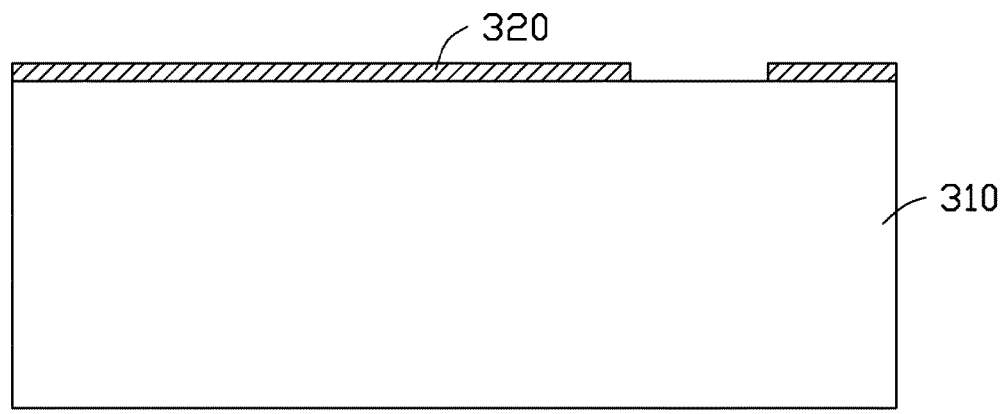
FIGS. 3-28 are schematic sectional views illustrating various stages in the manufacturing of the LED cell according to some embodiments of the present disclosure.

FIG. 3 is a schematic sectional view of a stage in the manufacturing of the LED cell 110 according to some embodiments of the present disclosure. FIG. 3 illustrates a structure after a substrate 310 that includes a patterned dielectric layer 320 on a top surface thereof is provided. The substrate 310 may be a semiconductor substrate, such as a bulk semiconductor substrate, a semiconductor-on-insulator (SOI) substrate, a multi-layered or gradient substrate, or the like. The substrate 310 may be doped or undoped and include a semiconductor material, such as an elemental semiconductor including Si, Ge, a compound or alloy semiconductor including SiGe, SiC, GaAs, GaP, GaAsP, AlInAs, AlGaAs, GaInAs, InAs, GaInP, InP, InSb, GaInAsP, and the like. In this exemplary embodiment, the substrate 310 is a bulk silicon substrate and the top surface of the substrate 310 has a (100) facet.

In some embodiments, the substrate 310 is formed with a well region therein. The formation of the well region in the substrate 310 may include: depositing a mask layer over the substrate 310; patterning the mask layer to expose a portion of the substrate 310; implanting impurities in the portion of the substrate 310 exposed by the mask layer; and removing the mask layer, such as by a wet or dry etching process or a combination thereof.

The dielectric layer 320 may be formed by oxidizing the top surface of the substrate 310, such as by a thermal oxidation, chemical oxidation, any suitable oxidation process, or a combination thereof. In an alternative embodiment, the dielectric layer 320 is formed by depositing a dielectric material on the top surface of the substrate 310, such as by a chemical vapor deposition (CVD), a physical vapor deposition (PVD), an atomic layer deposition (ALD), variations/derivatives thereof, any suitable deposition technique, or a combination thereof. Examples of materials for the dielectric layer 320 include, but are not limited to, $SiO_2$, SiN, SiON, SiCN, and SiOCN. The dielectric layer 320 may have a thickness of less than about 100 nm. The dielectric layer 320 may be patterned using, e.g., an electron beam lithography.

Figure 4:
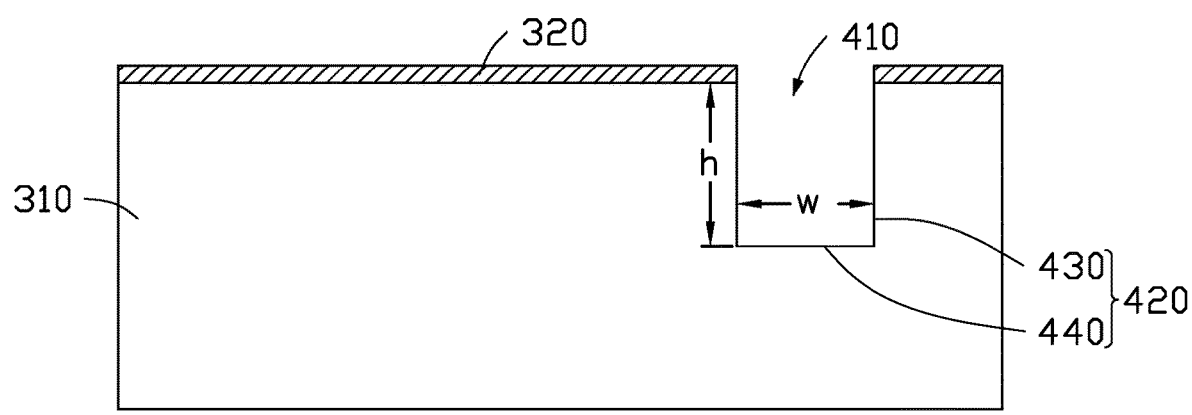

FIG. 4 is a schematic sectional view of another stage in the manufacturing of the LED cell 110 according to some embodiments of the present disclosure. FIG. 4 illustrates a structure after a hole 410 is formed in the substrate 310. The hole 410 is formed by a wet or dry etching process, e.g., a reactive-ion etching (RIE) process, a neutral beam etching (NBE) process, and the like or a combination thereof, using the dielectric layer 320 as a mask.

As shown in FIG. 4, the hole 410 has a substantially rectangular cross-section and is defined by a hole-defining wall 420 that includes a wall surface 430 and a bottom surface 440. The wall surface 430 extends upwardly from a periphery of the bottom surface 440 and is substantially perpendicular to the top surface of the substrate 310. In an exemplary embodiment, the hole 410 has a depth, i.e., the wall surface 430 of the hole-defining wall 420 has a height (h), of about 100 nm to about 700 nm, e.g., about 500 nm. In such an exemplary embodiment, the bottom surface 440 of the hole-defining wall 420 has a width (w) of about 100 nm to about 700 nm, e.g., 500 nm.

Figure 5:
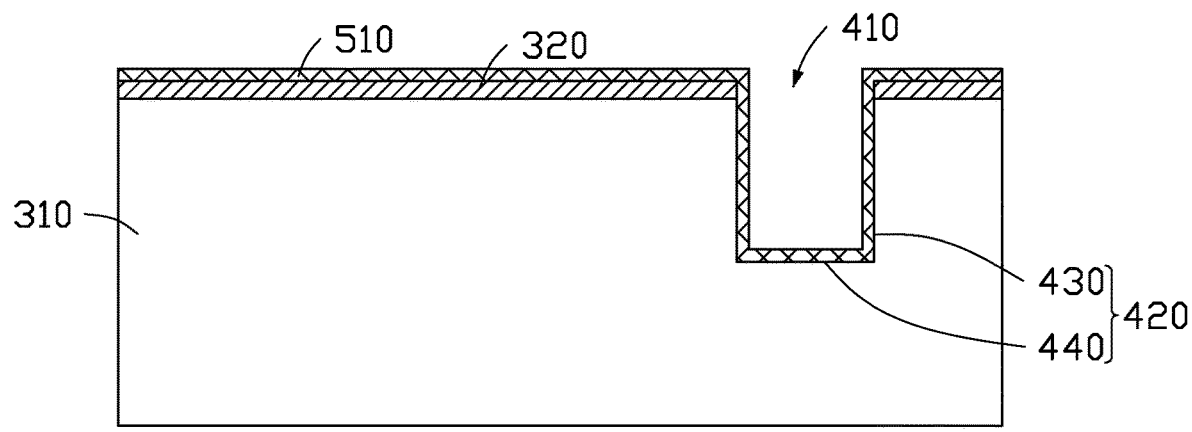

FIG. 5 is a schematic sectional view of another stage in the manufacturing of the LED cell 110 according to some embodiments of the present disclosure. FIG. 5 illustrates a structure after a blocking layer 510 is formed on the wall surface 430 and the bottom surface 440 of the hole-defining wall 420. The blocking layer 510 may be formed using CVD, PVD, ALD, their variations, e.g., plasma enhanced CVD (PECVD), high density plasma CVD (HDP-CVD), flowable CVD (FCVD), any suitable deposition technique, or a combination thereof. The blocking layer 510 may include a nitride-based material, such as SiN, SiCN, SiON, SiOCN, and the like, or an oxide-based material, such as $SiO_2$. In some embodiments, the blocking layer 510 has a thickness of about 100 nm to about 300, e.g., 200 nm. In other embodiments, the blocking layer 510 has a thickness of about 150 nm to about 250 nm, e.g., 200 nm.

Figure 6:
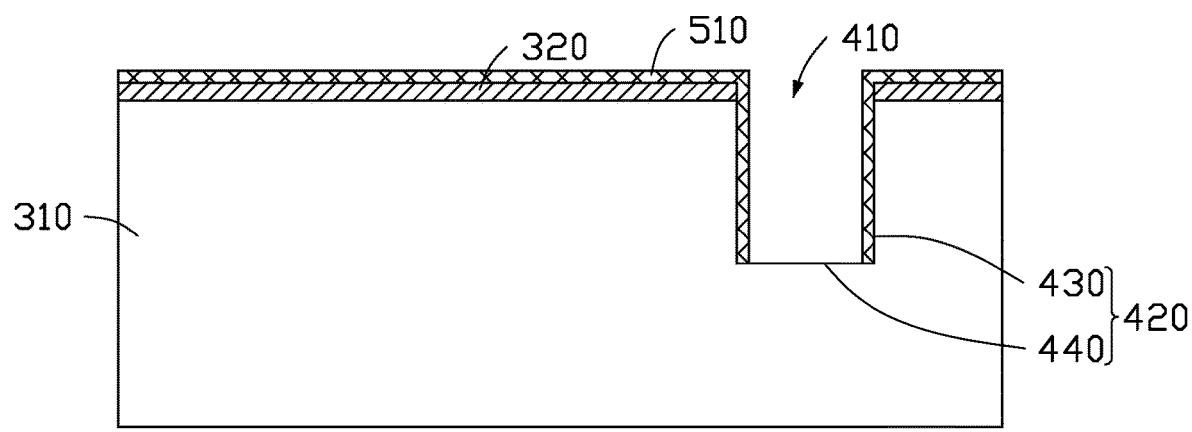

FIG. 6 is a schematic sectional view of another stage in the manufacturing of the LED cell 110 according to some embodiments of the present disclosure. FIG. 6 illustrates a structure after the blocking layer 510 on the bottom surface 440 of the hole-defining wall 420 is removed, exposing the bottom surface 440 of the hole-defining wall 420. In some embodiments, the blocking layer 510 on the bottom surface 440 of the hole-defining wall 420 may be removed using an inductively coupled plasma (ICP) etching process, an RIE process, any suitable dry etching process, or a combination thereof. In other embodiments, the blocking layer 510 on the bottom surface 440 of the hole-defining wall 420 is removed by a wet etching process or a combination of wet and dry etching processes.

Figure 7:
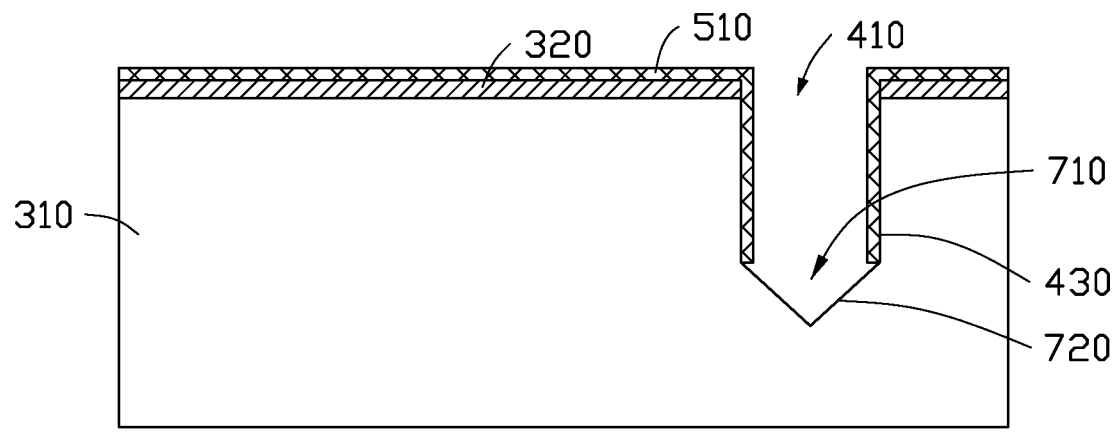

FIG. 7 is a schematic sectional view of another stage in the manufacturing of the LED cell 110 according to some embodiments of the present disclosure. FIG. 7 illustrates a structure after a groove 710 is formed in the substrate 310. The groove 710 is formed by etching the bottom surface (labeled 440 in FIG. 6) using the blocking layer 510 on the wall surface 430 as a mask. In some embodiments, the bottom surface 440 is etched using a wet etching process. In such some embodiments, the wet etching process is performed using an etching solution, e.g., KOH, heated to from about 70° C. to about 90° C., e.g., 80° C., for about 100 seconds to about 120 seconds, e.g., about 110 seconds. In other embodiments, the bottom surface 440 may be etched using a dry etching process or a combination of wet and dry etching processes.

As shown in FIG. 7, the groove 710 has a substantially triangular cross-section and is defined by a groove-defining wall 720. The groove-defining wall 720 tapers toward a bottom surface of the substrate 310 and includes opposite inclined surfaces, each of which has a (111) facet.

Figure 8:
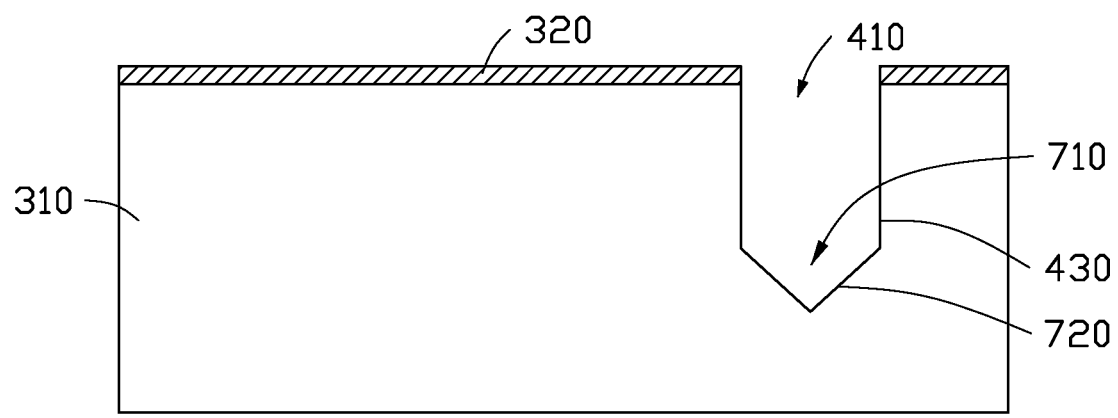

FIG. 8 is a schematic sectional view of another stage in the manufacturing of the LED cell 110 according to some embodiments of the present disclosure. FIG. 8 illustrates a structure after the blocking layer 510 on the wall surface 430 is removed, using an ICP etching process, an RIE process, any suitable dry etching process, or a combination thereof. In an alternative embodiment, the blocking layer 510 on the wall surface 430 is removed by a wet etching process or a combination of wet and dry etching processes.

Figure 9:
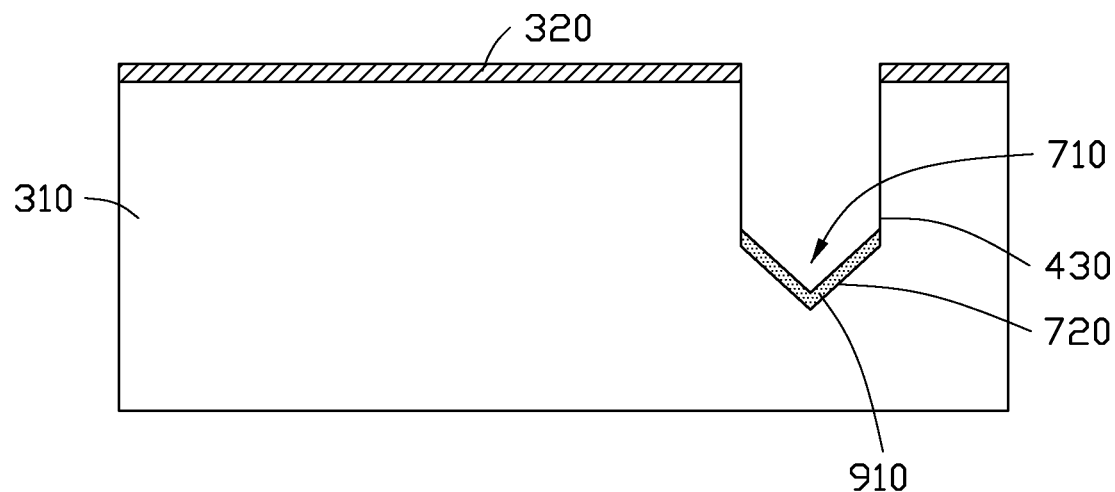

FIG. 9 is a schematic sectional view of another stage in the manufacturing of the LED cell 110 according to some embodiments of the present disclosure. FIG. 9 illustrates a structure after a buffer layer 910 is formed on the groove-defining wall 720. The buffer layer 910 may have a thickness of about 100 nm to about 500 nm, e.g., about 200 nm. Examples of materials for the buffer layer 910 include, but are not limited to, AlN, TiN, TaN, HfN, and ZrN. The buffer layer 910 may be formed using CVD, PVD, ALD, their variations, such as metal organic CVD (MOCVD), any suitable deposition technique, or a combination thereof.

Figure 10:
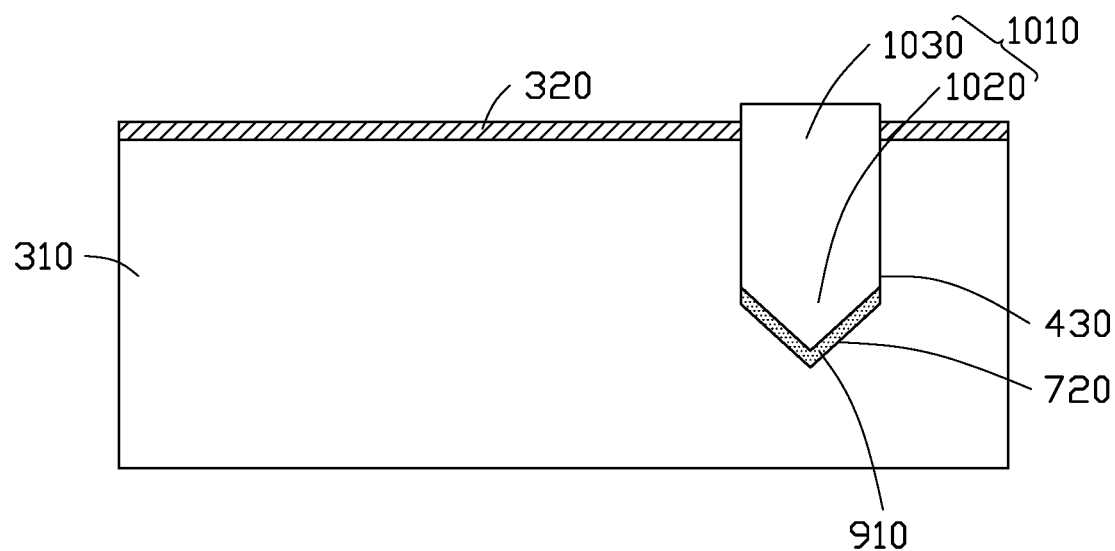

FIG. 10 is a schematic sectional view of another stage in the manufacturing of the LED cell 110 according to some embodiments of the present disclosure. FIG. 10 illustrates a structure after a first LED layer 1010 of an LED, e.g., LED 140, of the LED cell 110 is formed over the buffer layer 910. In this exemplary embodiment, the formation of the first LED layer 1010 includes: growing a III-V compound semiconductor on the buffer layer 910; implanting the compound semiconductor with n-type impurities; and doping the III-V compound semiconductor with dopants, e.g., silicon.

The first LED layer 1010 is grown such that the compound semiconductor, e.g., GaN, transitions from a hexagonal III-V compound semiconductor, e.g., h-GaN, i.e., at a lower portion 1020 of the first LED layer 1010, to a cubic III-V compound semiconductor, e.g., c-GaN, i.e., at an upper portion 1030 of the first LED layer 1010. The upper portion 1030 of the first LED layer 1010, i.e., the cubic compound semiconductor, includes a top surface that has a facet, e.g. (100), the same as the facet of the top surface of the substrate 310.

Although the III-V compound semiconductor of the first LED layer 1010 is exemplified as GaN, the III-V compound semiconductor of the first LED layer 1010 may include InP, InAs, GaAs, InSb, or any suitable alloy of two or more III-V compound semiconductor.

Figure 11:
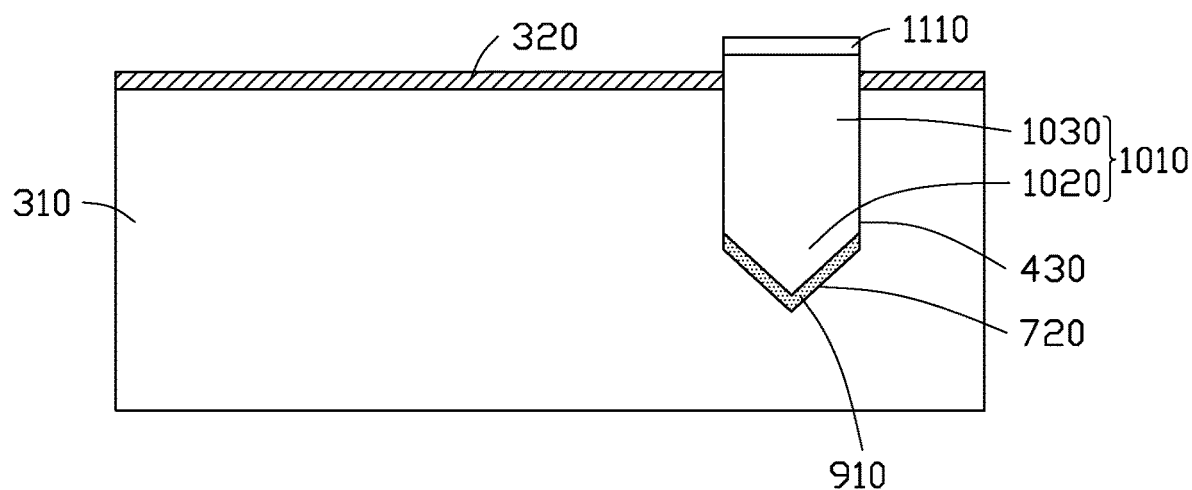

FIG. 11 is a schematic sectional view of another stage in the manufacturing of the LED cell 110 according to some embodiments of the present disclosure. FIG. 11 illustrates a structure after a light-generating layer 1110 of the LED 140 is formed over the first LED layer 1010. In some embodiments, the light-generating layer 1110 includes a single quantum well (SQW). In other embodiments, the light-generating layer 1110 includes a multiple quantum well (MQW). In such other embodiments, the light-generating layer 1110 may include a plurality of alternating well layers, e.g., GaN, and barrier layers, e.g., AlGaN. The light-generating layer 1110 may be grown on the first LED layer 1010 using CVD, PVD, ALD, their variations, such as MOCVD, any suitable deposition technique, or a combination thereof.

Figure 12:
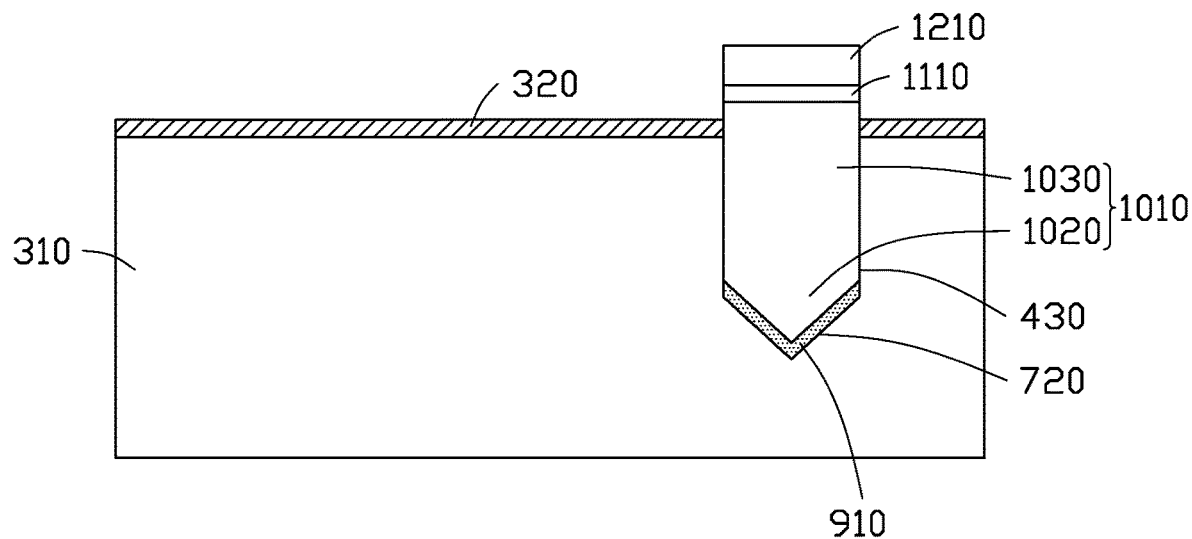

FIG. 12 is a schematic sectional view of another stage in the manufacturing of the LED cell 110 according to some embodiments of the present disclosure. FIG. 12 illustrates a structure after a second LED layer 1210 of the LED 140 is formed over the light-generating layer 1110. In this exemplary embodiment, the formation of the second LED layer 1210 includes growing a III-V compound semiconductor, e.g., GaN, on the light-generating layer 1110 and implanting the III-V compound semiconductor with p-type impurities. In some embodiments, the second LED layer 1210 includes GaN. In other embodiments, the second LED layer 1210 includes InP, InAs, GaAs, InSb, or any suitable alloy of two or more III-V compound semiconductor. The second LED layer 1210 may have a thickness of about 100 nm to about 500 nm, e.g., about 150 nm.

Figure 13:
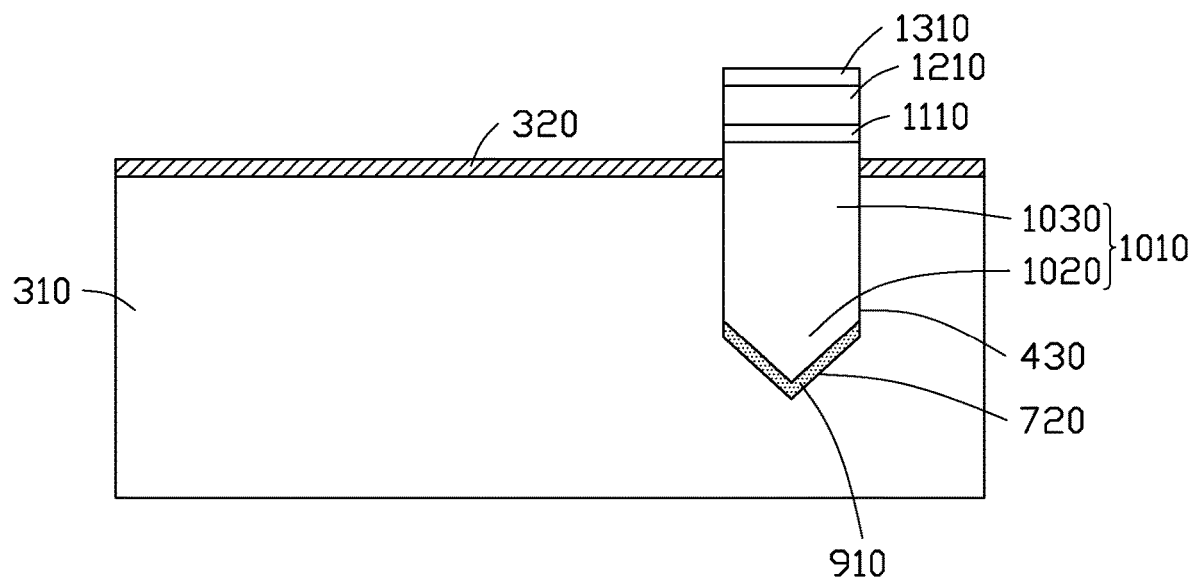

FIG. 13 is a schematic sectional view of another stage in the manufacturing of the LED cell 110 according to some embodiments of the present disclosure. FIG. 13 illustrates a structure after a current spreading layer 1310 is formed over the second LED layer 1210. In this exemplary embodiment, the formation of the current spreading layer 1310 includes: depositing a photoresist layer over the structure of FIG. 12; patterning the photoresist layer to expose a top surface of the second LED layer 1210; depositing a transparent conductive layer (TCL) on the top surface of the second LED layer 1210 exposed by the photoresist layer; and removing the photoresist layer. Examples of materials for the TCL include, but are not limited to, Ni, Au, Ag, Pt, and Pd, metal oxides such as InZnO (IZO), InO, ZnO, InSnO (ITO), SnO, SbSnO (ATO), SbO, SbZnO (AZO), CdSnO (CTO), and CdO, and metal nitrides such as TiN, WN, and TiWN. The current spreading layer 1310 may have a thickness of about 10 nm to about 100 nm.

Figure 14:
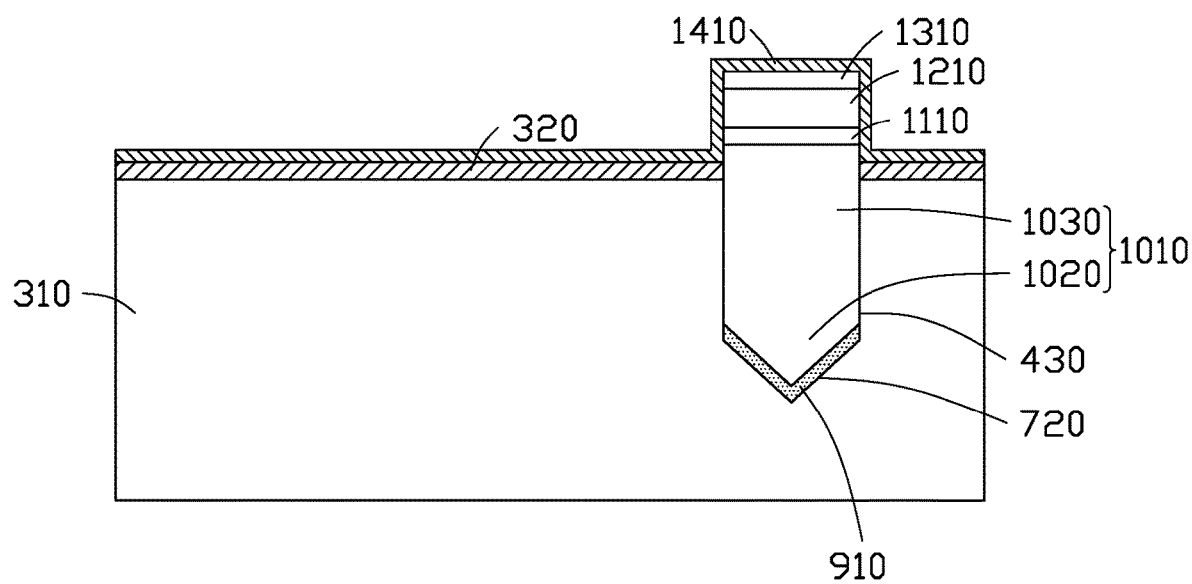

FIG. 14 is a schematic sectional view of another stage in the manufacturing of the LED cell 110 according to some embodiments of the present disclosure. FIG. 14 illustrates a structure after a protection layer 1410 is formed over the structure of FIG. 13. Examples of materials for the protection layer 1410 include, but are not limited to, $SiO_2$, SiN, SiON, SiCN, and SiOCN. As will be apparent hereinbelow, upon reading of the present disclosure, the protection layer 1410 is configured to prevent damage to the LED 140 during subsequent processes of forming a transistor, e.g., transistor 150, of the LED cell 110.

Figure 15:
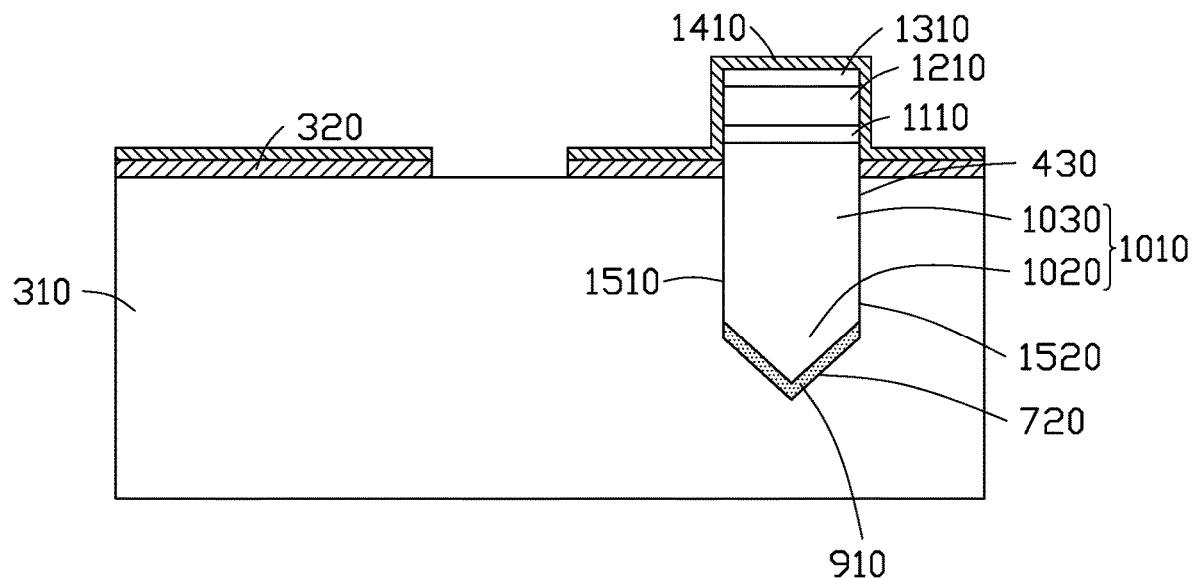

FIG. 15 is a schematic sectional view of another stage in the manufacturing of the LED cell 110 according to some embodiments of the present disclosure. FIG. 15 illustrates a structure after the layers 320, 1410 on the top surface of the substrate 310 adjacent a first sidewall 1510 of the first LED layer 1010 are removed, such as by a wet or dry etching process or a combination thereof. As shown in FIG. 15, remaining layers 320, 1410 are on the top surface of the substrate 310 adjacent a second sidewall 1520 of the first LED layer 1010 opposite the first sidewall 1510 of the first LED layer 1010.

Figure 16:
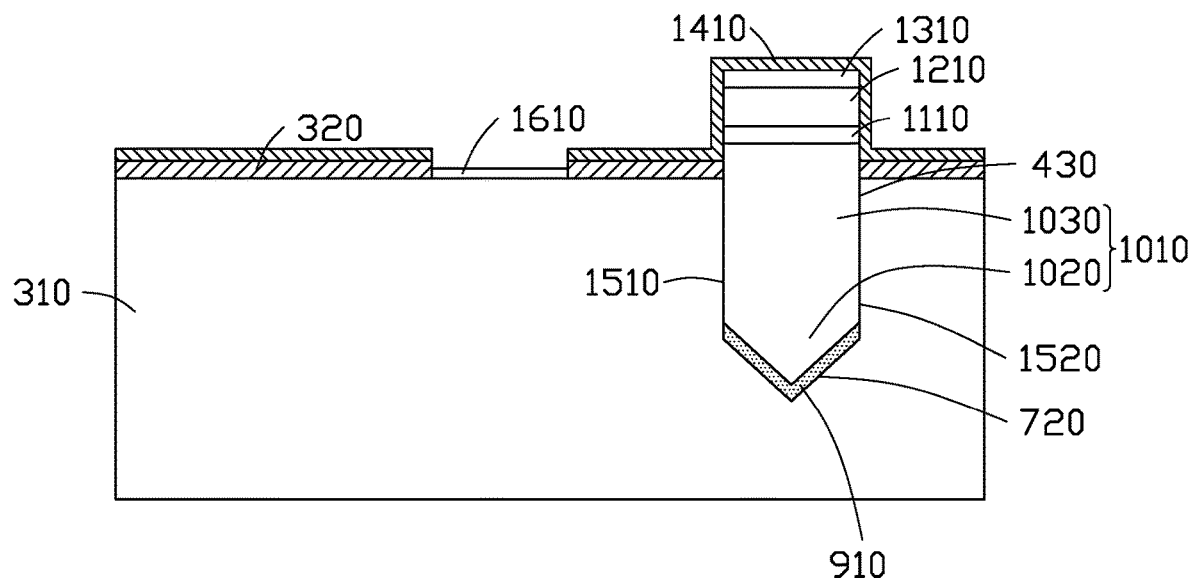

FIG. 16 is a schematic sectional view of another stage in the manufacturing of the LED cell 110 according to some embodiments of the present disclosure. FIG. 16 illustrates a structure after a gate dielectric 1610 of the transistor 150 is formed on the top surface of the substrate 310 exposed by the layers 320, 1410. The gate dielectric 1610 may include a dielectric material that has a dielectric constant from about 4, e.g., $SiO_2$, to about 8, e.g., SiN. Alternatively, the gate dielectric 1610 may include a higher dielectric constant dielectric material having a dielectric constant greater than about 8. Such higher dielectric constant dielectric materials may include, but are not limited to, HfO, HfSiO, HfZrO, TaO, ZrO, ZrSiO, LaO, AlO, TiO, YO, SrTO (STO), BaTiO (BTO), BaSnTn (BST), BaZrO, HfZrO, HfLaO, LaSiO, AlSiO, HfTaO, HfTiO, and PbZrTn (PZT).

Figure 17:
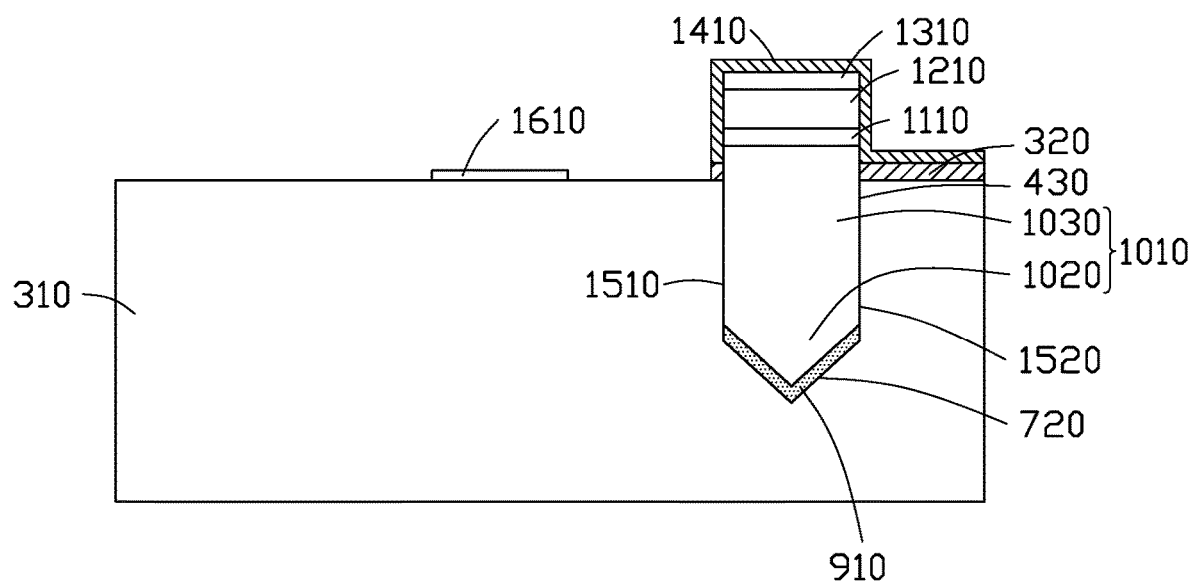

FIG. 17 is a schematic sectional view of another stage in the manufacturing of the LED cell 110 according to some embodiments of the present disclosure. FIG. 17 illustrates a structure after the layers 320, 1410 on the top surface of the substrate 310 adjacent the first sidewall 1510 of the first LED layer 1010 are removed, such as by a wet or dry etching process or a combination thereof.

Figure 18:
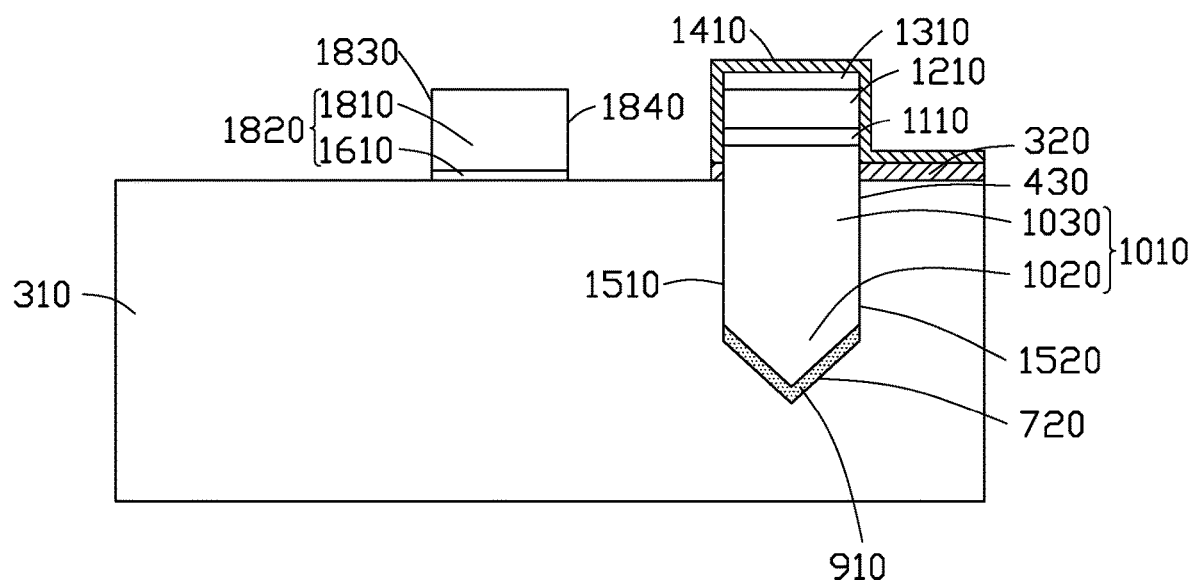

FIG. 18 is a schematic sectional view of another stage in the manufacturing of the LED cell 110 according to some embodiments of the present disclosure. FIG. 18 illustrates a structure after a gate electrode 1810 is formed over the gate dielectric 1610. The gate electrode 1810 may be formed by depositing a gate material using CVD, PVD, ALD, their variations, any suitable deposition technique, or a combination thereof, on a top surface of the gate dielectric 1610 and then by planarizing the deposited gate material using a chemical mechanical planarizing (CMP) technique. In some embodiments, the gate electrode 1810 includes polysilicon. In other embodiments, the gate electrode 1810 includes a metal layer. Examples of materials for the gate electrode 1810 include, but are not limited to, Ti, TiN, TiAl, Al, AlN, Ta, TaN, TaC, TaCN, TaSiN, and TaSi.

In certain embodiments, the gate electrode 1810 includes a metal layer and a work function metal layer, e.g., liner layer, wetting layer, adhesion layer, metal alloy, and metal silicide. The gate dielectric 1610 and the gate electrode 1810 constitute a gate structure 1820. As shown in FIG. 18, the gate structure 1820 has opposite first and second sidewalls 1830, 1840. In some embodiments, a distance between the second sidewall 1840 of the gate structure 1820 and the first sidewall 1510 of the first LED layer 1010 may be less than 50 nm, e.g., 30 nm. In other embodiments, a distance between the second sidewall 1840 of the gate structure 1820 and the first sidewall 1510 of the first LED layer 1010 may be less than 20 nm, e.g., 10 nm.

Figure 19:
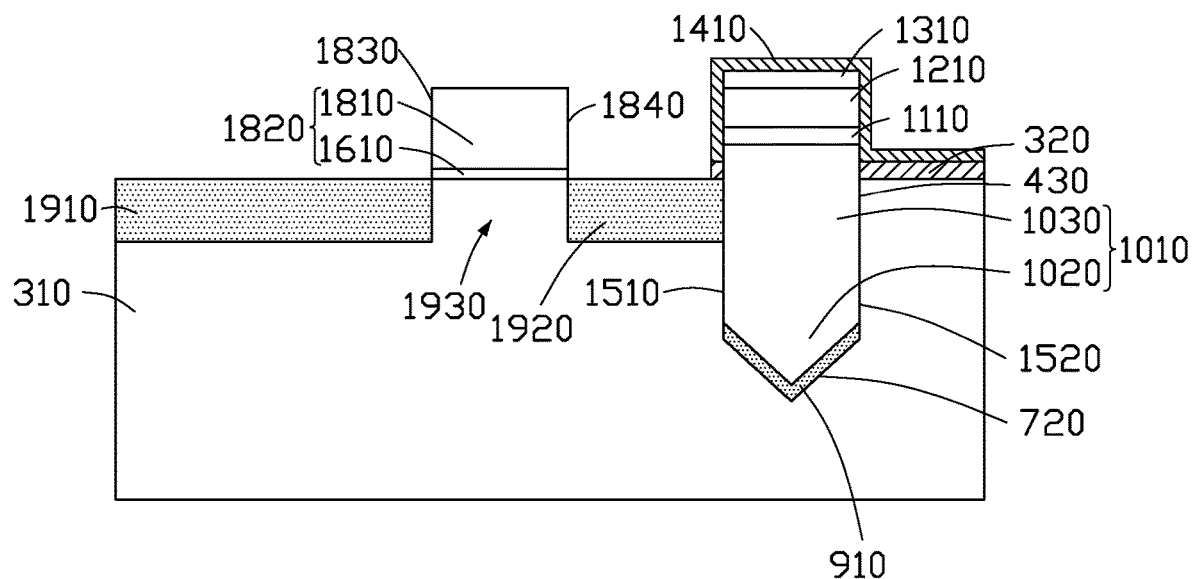

FIG. 19 is a schematic sectional view of another stage in the manufacturing of the LED cell 110 according to some embodiments of the present disclosure. FIG. 19 illustrates a structure after source and drain regions 1910, 1920 are formed adjacent the first and second sidewalls 1830, 1840 of the gate structure 1820, respectively. In this exemplary embodiment, the source and drain regions 1910, 1920 are formed by implanting n-type dopants in the substrate 310 using the gate structure 1820 as a mask, whereby a p-type channel 1930 is formed therebetween. Examples of materials for the n-type dopants include, but are not limited to, P, As, and Sb.

Although the source and drain regions 1910, 1920 are exemplified as implanted source and drain regions, in an alternative embodiment, the source and drain regions may be raised source and drain regions. In such an alternative embodiment, the formation of the raised source and drain regions includes: etching the substrate 310 to form a trench therein; growing epitaxial layer in the trench in the substrate 310 using CVD, PVD, ALD, their variations, e.g., MOCVD, any suitable deposition technique, or a combination thereof; and doping the epitaxial layer with n-type impurities. Each of the source and drain regions 1910, 1920 may include Si, SiC, SiCP, or the like.

Figure 20:
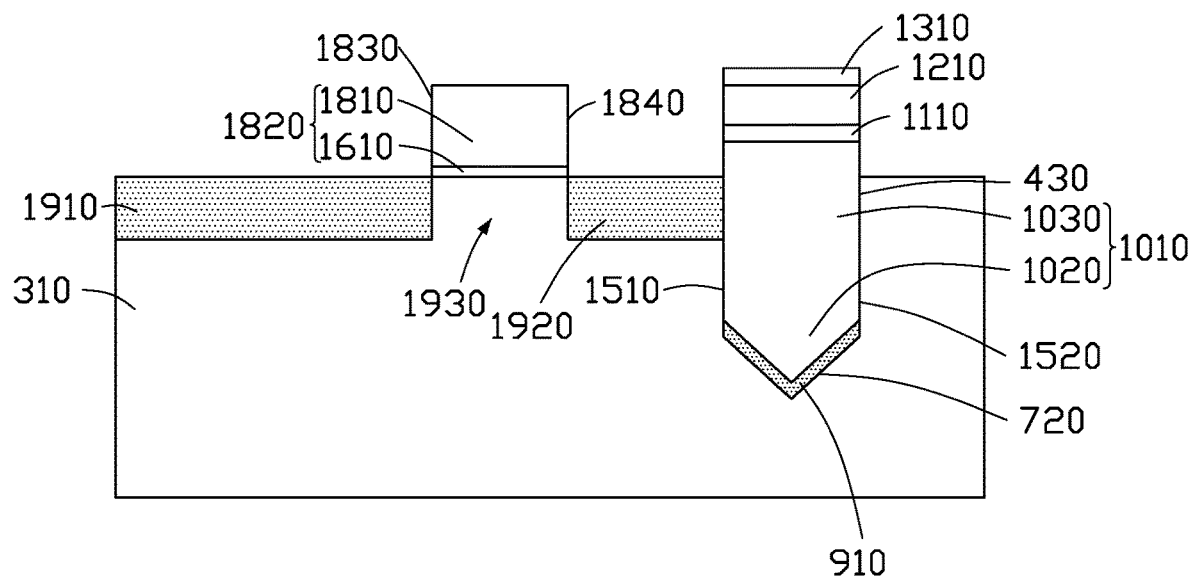

FIG. 20 is a schematic sectional view of another stage in the manufacturing of the LED cell 110 according to some embodiments of the present disclosure. FIG. 20 illustrates a structure after the layers (labeled 320, 1410 in FIG. 19) are removed, such as by a wet or dry etching process or a combination thereof.

Figure 21:
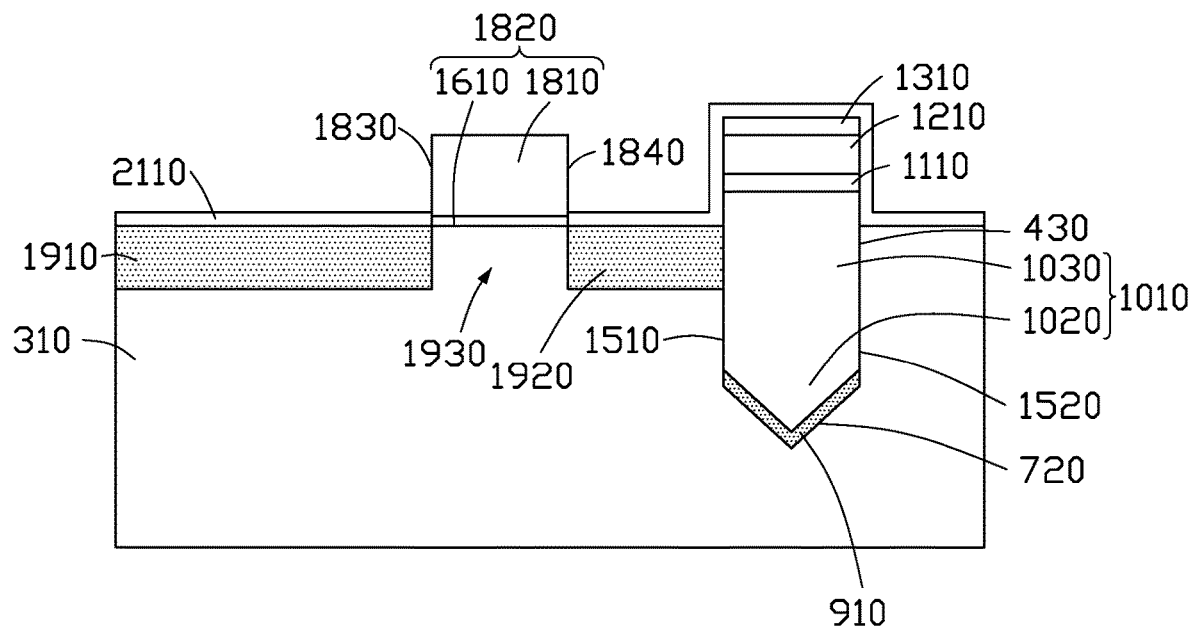

FIG. 21 is a schematic sectional view of another stage in the manufacturing of the LED cell 110 according to some embodiments of the present disclosure. FIG. 21 illustrates a structure after a passivation layer 2110 is formed over the structure of FIG. 20. Examples of materials for the passivation layer 2110 include, but are not limited to, $SiO_2$, SiN, SiON, SiCN, and SiOCN. The passivation layer 2110 may be formed using CVD, PVD, ALD, their variations, e.g., PECVD, any suitable deposition technique, or a combination thereof.

Figure 22:
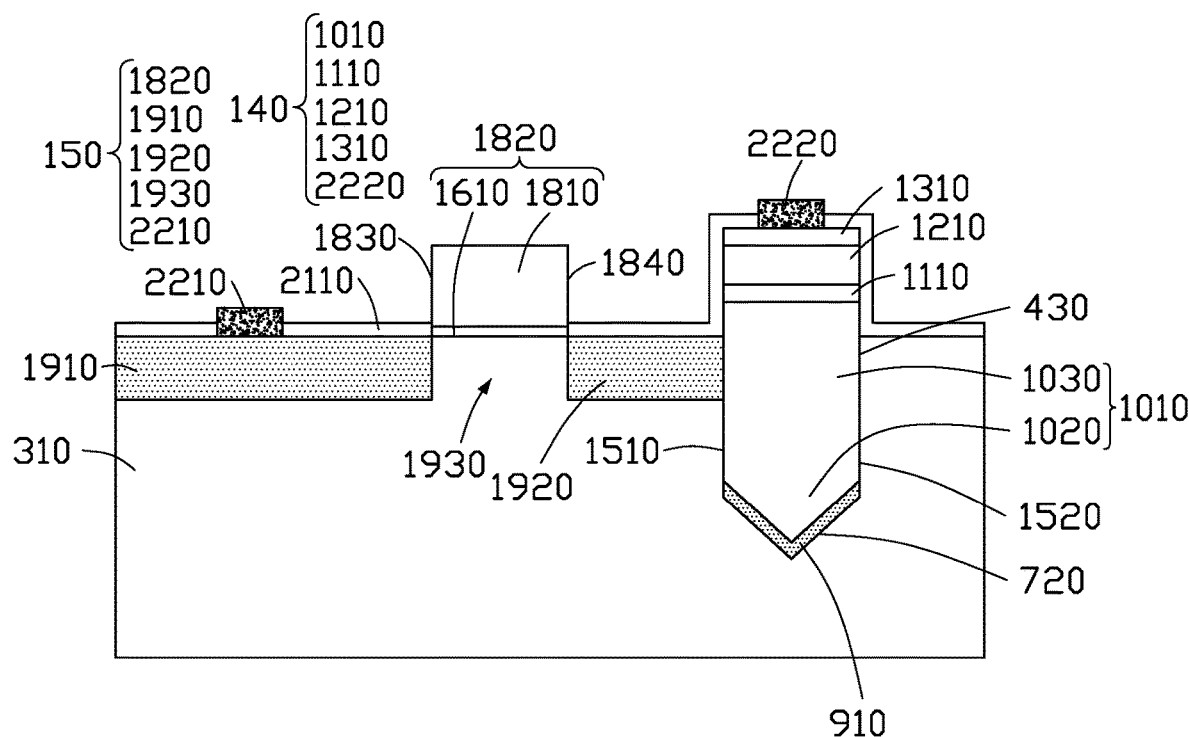

FIG. 22 is a schematic sectional view of another stage in the manufacturing of the LED cell 110 according to some embodiments of the present disclosure. FIG. 22 illustrates a structure after a source electrode 2210 and an LED electrode 2220 are formed over the transistor 150 and the LED 140, respectively. As shown in FIG. 22, the source electrode 2210 extends to the source region 1910 through the passivation layer 2110. The LED electrode 2220 extends to the current spreading layer 1310 through the passivation layer 2110. The first and second LED layers 1010, 1210, the light-generating layer 1110, the current spreading layer 1310, and the LED electrode 2220 constitute the LED 140. The gate structure 1820, the source and drain regions 1910, 1920, the channel 1930, and the source electrode 2210 constitute the transistor 150. In an alternative embodiment, the LED electrode 2220 extends to the second LED layer 1210 through the passivation layer 2110 and the current spreading layer 1310.

In this exemplary embodiment, the formation of the electrodes 2210, 2220 are performed at the same time. Examples of materials for the electrodes 2210, 2220 include, but are not limited to, Al, Ag, Cu, Au, Cr, Ti, any suitable metal, or an alloy thereof. In some embodiments, the electrodes 2210, 2220 are formed using CVD, PVD, ALD, their variations, any suitable deposition technique, or a combination thereof. As illustrated in FIG. 22, the thus formed LED cell 110 includes a substrate 310, a buffer layer 910, an LED 140, a transistor 150, and a passivation layer 2110. The substrate 310 may be a semiconductor substrate, such as a bulk semiconductor substrate, an SOI substrate, a multi-layered or gradient substrate, or the like. The substrate 310 may include a semiconductor material, such as an elemental semiconductor including Si, Ge, a compound or alloy semiconductor including SiGe, SiC, GaAs, GaP, GaAsP, AlInAs, AlGaAs, GaInAs, InAs, GaInP, InP, InSb, GaInAsP, and the like. The substrate 310 may be doped or undoped. In this exemplary embodiment, the substrate 310 is a bulk silicon substrate and includes a top surface that has a (100) facet.

The buffer layer 910 is formed in the substrate 310. The buffer layer 910 may have a thickness of about 100 nm to about 500 nm, e.g., about 200 nm. Examples of materials for the buffer layer 910 include, but are not limited to, AlN, GaN, TiN, TaN, HfN, and ZrN.

The LED 140 includes first and second LED layers 1010, 1210, a light-generating layer 1110, a current spreading layer 1310, and an LED electrode 2220. The first LED layer 1010 extends to the buffer layer 910 through the top surface of the substrate 310 and includes a lower portion 1020 and an upper portion 1030. The lower portion 1020 of the first LED layer 1010 has a substantially triangular cross-section, tapers toward a bottom surface of the substrate 310, and includes opposite inclined surfaces, each of which has a (111) facet. In this exemplary embodiment, the lower portion 1020 of the first LED layer 1010 is a hexagonal III-V compound semiconductor, e.g., h-GaN.

The upper portion 1030 of the first LED layer 1010 has a substantially rectangular cross-section and includes opposite first and second sidewalls 1510, 1520 substantially perpendicular to the top surface of the substrate 310. In this exemplary embodiment, upper portion 1030 of the first LED layer 1010 is a cubic III-V compound semiconductor, e.g., c-GaN, a top surface of which has a facet, e.g. (100), the same as the facet of the top surface of the substrate 310.

Although the first LED layer 1010 is exemplified as GaN, the first LED layer 1010 may include InP, InAs, GaAs, InSb, or any suitable alloy of two or more III-V compound semiconductor.

The light-generating layer 1110 is between the first and second LED layers 1010, 1210. In some embodiments, the light-generating layer 1110 covers opposite end portions of the top surface of the first LED layer 1010. In other embodiments, the light-generating layer 1110 covers opposite end portions of the top surface of the first LED layer 1010 and an intermediate portion between the opposite end portions of the top surface of the first LED layer 1010. In such other embodiments, the light-generating layer 1110 may cover the entire top surface of the first LED layer 1010. In an embodiment, the light-generating layer 1110 includes an SQW. In an alternative embodiment, the light-generating layer 1110 includes an MQW. In such an alternative embodiment, the light-generating layer 1110 may include a plurality of alternating well layers, e.g., GaN, and barrier layers, e.g., AlGaN.

The second LED layer 1210, in some embodiments, covers opposite end portions of the top surface of the first LED layer 1010. In other embodiments, the second LED layer 1210 covers opposite end portions of the top surface of the first LED layer 1010 and an intermediate portion between the opposite end portions of the top surface of the first LED layer 1010. In such other embodiments, the second LED layer 1210 may cover the entire top surface of the first LED layer 1010. In this exemplary embodiment, the second LED layer 1210 includes a III-V compound semiconductor. In some embodiments, the second LED layer 1210 includes GaN. In other embodiments, the second LED layer 1210 includes InP, InAs, GaAs, InSb, or any suitable alloy of two or more III-V compound semiconductor. The second LED layer 1210 may have a thickness of about 100 nm to about 500 nm, e.g., about 150 nm.

The current spreading layer 1310, in some embodiments, covers opposite end portions of the top surface of the first LED layer 1010. In other embodiments, the current spreading layer 1310 covers opposite end portions of the top surface of the first LED layer 1010 and an intermediate portion between the opposite end portions of the top surface of the first LED layer 1010. In such other embodiments, the current spreading layer 1310 covers the entire top surface of the first LED layer 1010.

In this exemplary embodiment, the current spreading layer 1310 includes a TCL. Examples of materials for the TCL include, but are not limited to, Ni, Au, Ag, Pt, and Pd, metal oxides such as IZO, InO, ZnO, ITO, SnO, ATOSbO, AZO, CTO, and CdO, and metal nitrides such as TiN, WN, and TiWN. The current spreading layer 1310 may have a thickness of about 10 nm to about 100 nm.

The LED electrode 2220 is formed on, i.e., connected to, a top surface of the current spreading layer 1310. Examples of materials for the LED electrode 2220 include, but are not limited to, Al, Ag, Cu, Au, Cr, Ti, any suitable metal, or an alloy thereof. In an alternative embodiment, the LED electrode 2220 extends to the top surface of the second LED layer 1210 through the current spreading layer 1310. In such an alternative embodiment, the LED electrode 2220 and the current spreading layer 1310 may cover the entire top surface of the first LED layer 1010.

As shown in FIG. 22, while an LED electrode, e.g., LED electrode 2220, is associated with or is connected to the second LED layer 1210, there is no LED electrode associated with or connected to the first LED layer 1010. That is, there is no LED electrode formed on a top surface of the first LED layer 1010 or on a bottom surface of the first LED layer 1010. In other words, the first LED layer 1010 is free of an LED electrode.

The transistor 150 includes a gate structure 1820, source and drain regions 1910, 1920, and a source electrode 2210. The gate structure 1820 includes a gate dielectric 1610 on the top surface of the substrate 310 and a gate electrode 1810 on a top surface of the gate dielectric 1610. The source and drain regions 1910, 1920 are adjacent opposite first and second sidewalls 1830, 1840 of the gate structure 1820, respectively. As shown in FIG. 22, the drain region 1920 is formed on, i.e., connected to or in contact with, a first sidewall 1510 of the first LED layer 1010.

It is noted that, while the drain region 1920 is connected to or present on the first sidewall 1510 of the first LED layer 1010, the drain region 1920 is absent from a second sidewall 1520 of the first LED layer 1010 opposite the first sidewall 1510 of the first LED layer 1010. In other words, the second sidewall 1520 of the first LED layer 1010 is free of the drain region 1920. That is to say, the drain region 1920 of the transistor 150 serves as an LED electrode of the first LED layer 1010 of the LED 140.

In some embodiments, a distance between the second sidewall 1840 of the gate structure 1820 and the first sidewall 1510 of the first LED layer 1010 is less than 50 nm, e.g., 30 nm. In other embodiments, a distance between the second sidewall 1840 of the gate structure 1820 and the first sidewall 1510 of the first LED layer 1010 is less than 20 nm, e.g., 10 nm.

The source electrode 2210 is formed on, i.e., connected to, the source region 1910. Examples of materials for the source electrode 2210 include, but are not limited to, Al, Ag, Cu, Au, Cr, Ti, any suitable metal, or an alloy thereof. The passivation layer 2110 is formed on the top surface of the source region 1910, the top surface of the drain region 1920, and the top surface of the LED 140, and surrounds the electrodes 2210, 2220. Examples of materials for the passivation layer 2110 include, but are not limited to, $SiO_2$, SiN, SiON, SiCN, and SiOCN. In this exemplary embodiment, the passivation layer 2110 covers the entire top surface of the drain region 1920.

As shown in FIG. 22, while a source electrode, e.g., source electrode 2210, is associated with or is connected to the source region 1910, there is no drain electrode associated with or connected to the drain region 1920. That is, there is no drain electrode formed on the top surface of the drain region 1920. In other words, the drain region 1920 is free of a drain electrode.

Figure 23:
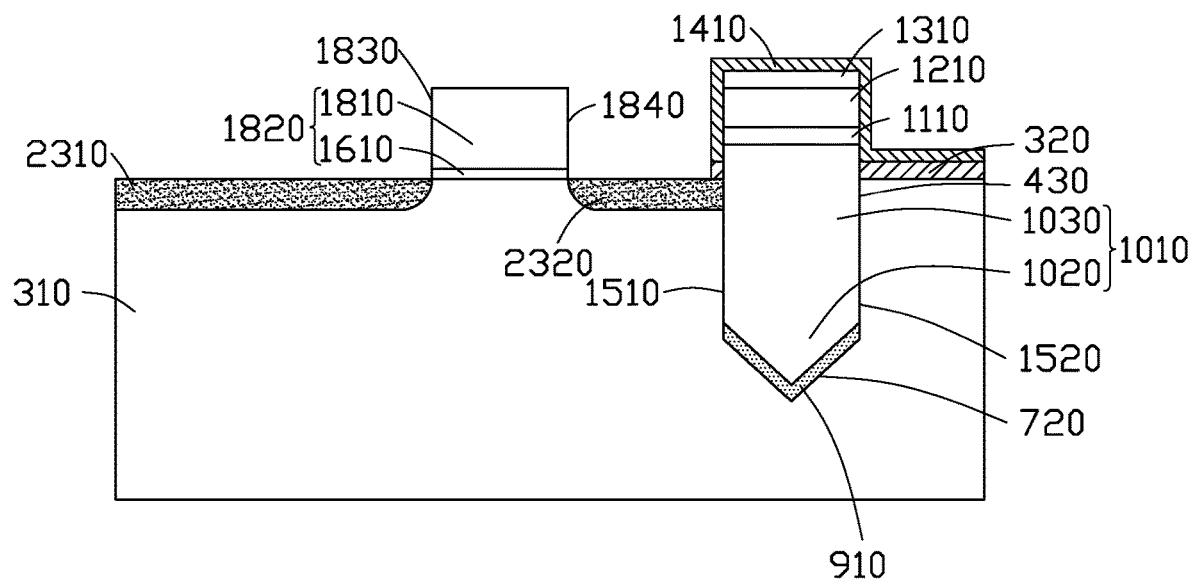

The transistor 150 as described herein may include additional features. For example, FIG. 23 is a schematic sectional view of another stage in the manufacturing of the LED cell 110 according to some embodiments of the present disclosure. FIG. 23 illustrates a structure after a pair of lightly doped source/drain regions 2310, 2320 are formed adjacent the first and second sidewalls 1830, 1840 of the gate structure 1820, respectively. In this exemplary embodiment, the lightly doped source/drain regions 2310, 2320 are formed by implanting n-type dopants in the substrate 310 using the gate structure 1820 as a mask. Examples of materials for the n-type dopants include, but are not limited to, P, As, and Sb.

Figure 24:
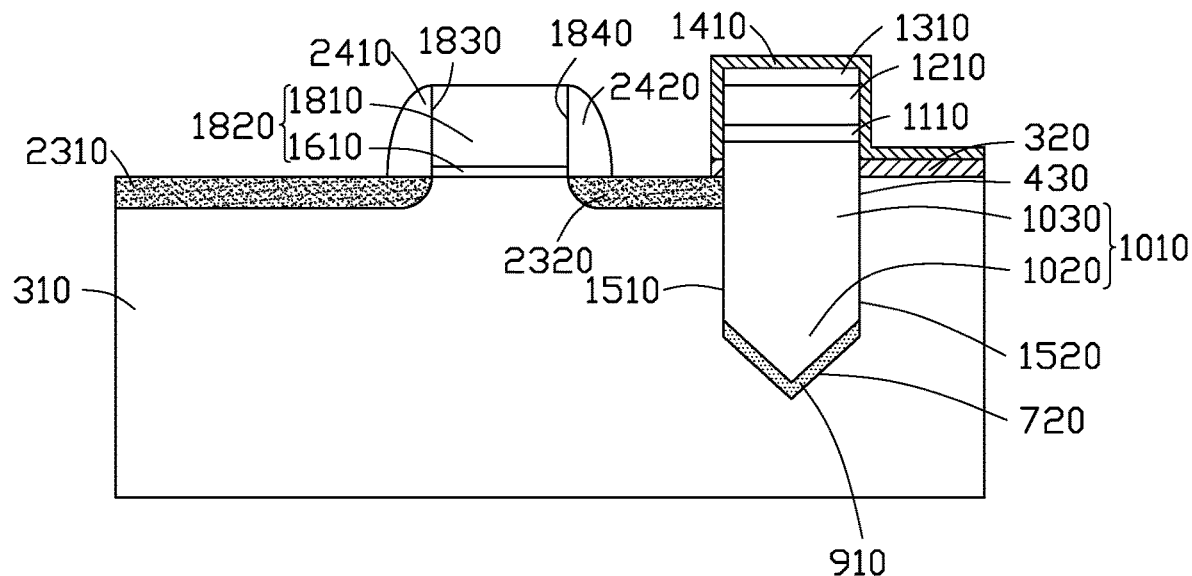

FIG. 24 is a schematic sectional view of another stage in the manufacturing of the LED cell 1010 according to some embodiments of the present disclosure. FIG. 24 illustrates a structure after a pair of gate spacers 2410, 2420 are formed on the first and second sidewalls 1830, 1840 of the gate structure 1820, respectively. Each of the gate spacers 2410, 2420 may include a plurality of spacer layers, such as main spacer layer, liner layers, and the like. In this exemplary embodiment, the gate spacers 2410, 2420 are formed by depositing a spacer material, such as $SiO_2$, SiN, SiC, SiON, or the like, on the gate structure 1820 and etching back the deposited spacer material using a wet or dry etching process or a combination thereof.

Figure 25:
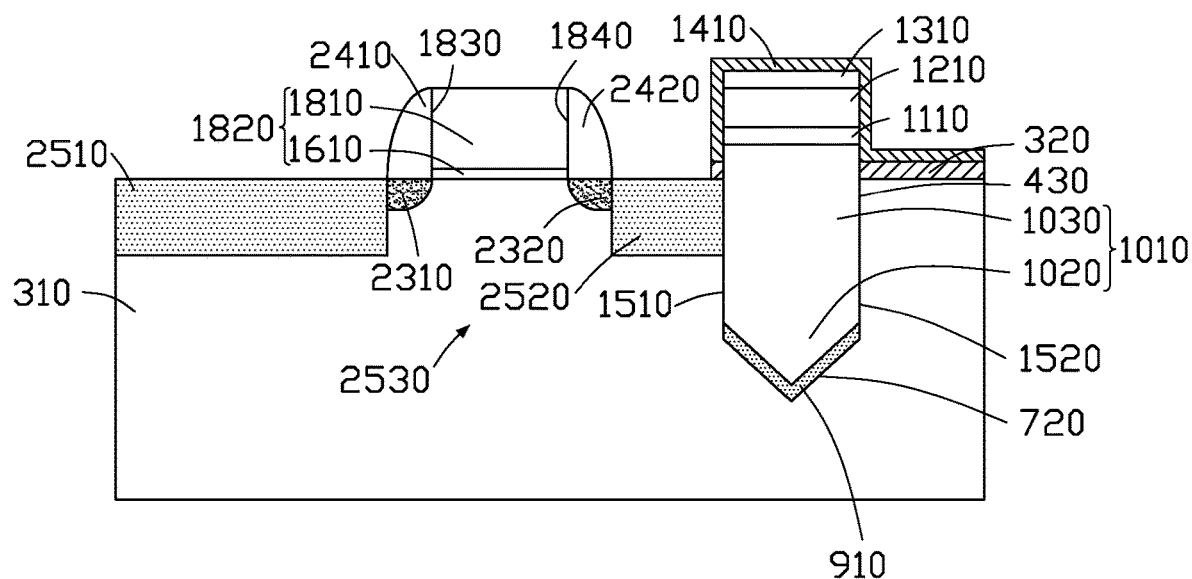

FIG. 25 is a schematic sectional view of another stage in the manufacturing of the LED cell 110 according to some embodiments of the present disclosure. FIG. 25 illustrates a structure after source and drain regions 2510, 2520 are formed adjacent the lightly doped source/drain regions 2310, 2320, respectively. In this exemplary embodiment, the source and drain regions 2510, 2520 are formed by implanting n-type dopants in the substrate 310 using the gate structure 1820 as a mask, whereby a p-type channel 2530 is formed therebetween. Examples of materials for the n-type dopants include, but are not limited to, P, As, and Sb.

Although the source and drain regions 2510, 2520 are exemplified as implanted source and drain regions, in an alternative embodiment, the source and drain regions may be raised source and drain regions. In such an alternative embodiment, the formation of the raised source and drain regions includes: etching the substrate 310 to form a trench therein; growing epitaxial layer in the trench in the substrate 310; and doping the epitaxial layer with n-type impurities. Each of the source and drain regions 1910, 1920 may include Si, SiC, SiCP, and the like.

Figure 26:
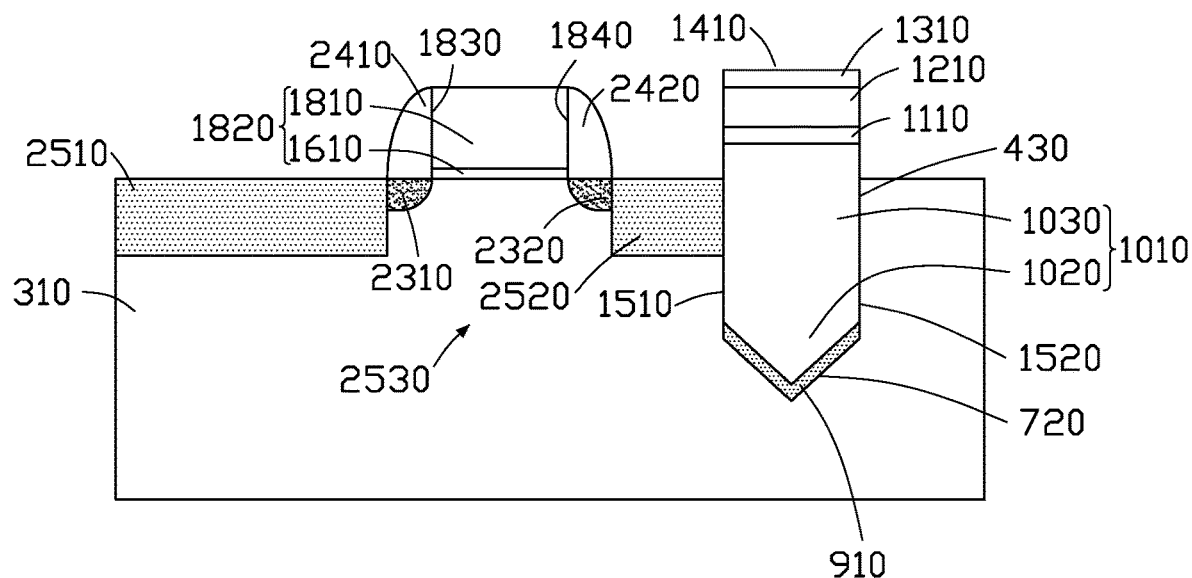

FIG. 26 is a schematic sectional view of another stage in the manufacturing of the LED cell 110 according to some embodiments of the present disclosure. FIG. 26 illustrates a structure after the layers (labeled 320, 1410 in FIG. 25) are removed, such as by a wet or dry etching process or a combination thereof.

Figure 27:
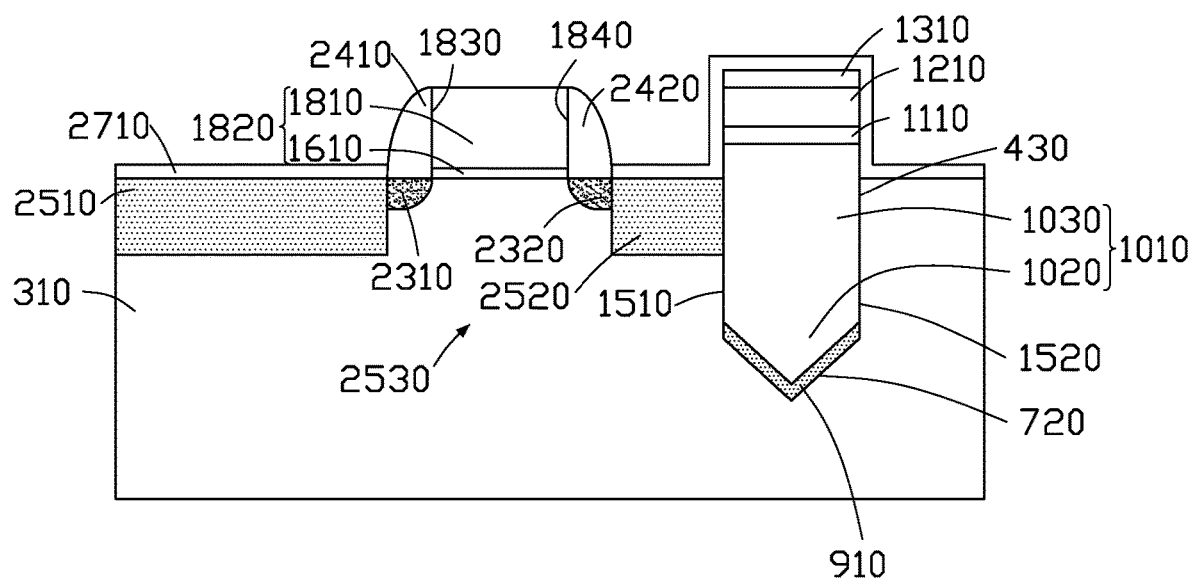

FIG. 27 is a schematic sectional view of another stage in the manufacturing of the LED cell 110 according to some embodiments of the present disclosure. FIG. 27 illustrates a structure after a passivation layer 2710 is formed over the structure of FIG. 26. Examples of materials for the passivation layer 2710 include, but are not limited to, $SiO_2$, SiN, SiON, SiCN, and SiOCN. The passivation layer 2710 may be formed using CVD, PVD, ALD, their variations, e.g., PECVD, any suitable deposition technique, or a combination thereof.

Figure 28:
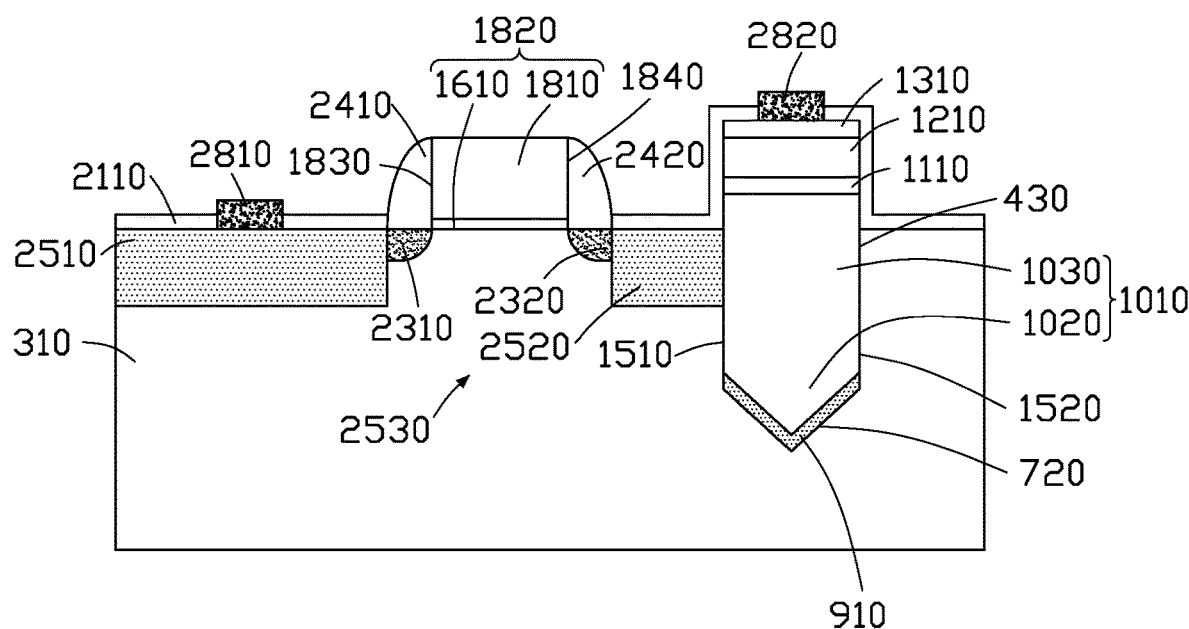

FIG. 28 is a schematic sectional view of another stage in the manufacturing of the LED cell 110 according to some embodiments of the present disclosure. FIG. 28 illustrates a structure after a source electrode 2810 and an LED electrode 2820 are formed over the transistor 150 and the LED 140, respectively. As shown in FIG. 28, the source electrode 2810 extends to the source region 2510 through the passivation layer 2710. The LED electrode 2820 extends to the current spreading layer 1310 through the passivation layer 2710. In this exemplary embodiment, the formation of the electrodes 2810, 2820 are performed at the same time. Examples of materials for the electrodes 2810, 2820 include, but are not limited to, Al, Ag, Cu, Au, Cr, Ti, any suitable metal, or an alloy thereof. In some embodiments, the electrodes 2810, 2820 are formed using CVD, PVD, ALD, their variations, any suitable deposition technique, or a combination thereof. In an alternative embodiment, the LED electrode 2820 extends to the second LED layer 1210 through the passivation layer 2710 and the current spreading layer 1310.

Although the cell 110 of the assembly 100 is exemplified using an LED, in an alternative embodiment, the cell may use a laser, a lamp, a bulb, or any suitable source of light.

Figure 29:
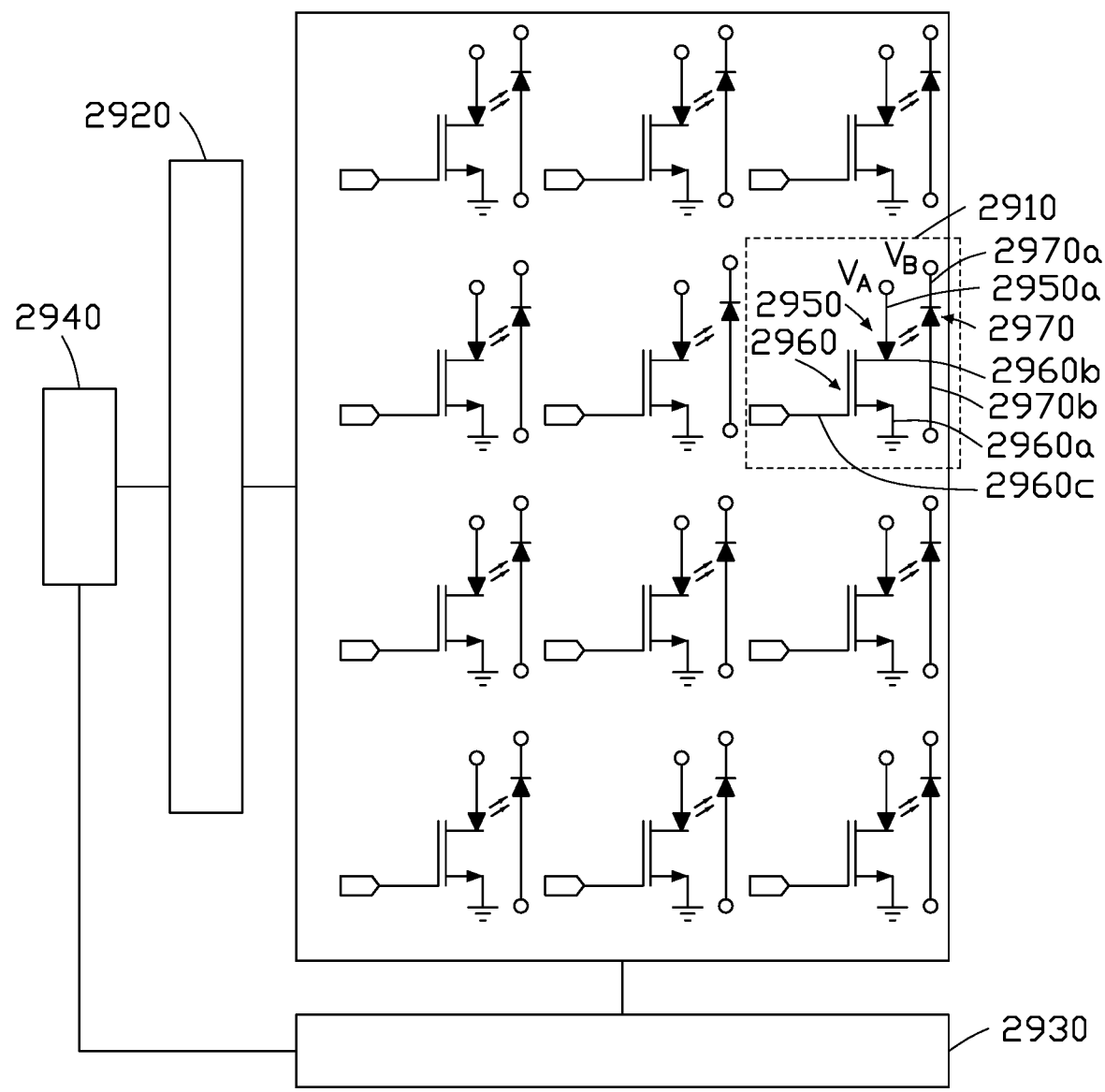
FIG. 29 is a schematic diagram illustrating an exemplary optical sensor assembly according to some embodiments of the present disclosure.

FIG. 29 is a schematic diagram illustrating an exemplary optical sensor assembly 2900 in accordance with some embodiments of the present disclosure. As shown in FIG. 29, the optical sensor assembly 2900 includes a plurality of optical sensor cells, e.g., optical sensor cell 2910, a row decoder 2920, a column decoder 2930, and a driving circuit 2940. The optical sensor cells are arranged in array of rows and columns. Since the optical sensor cells are similar in structure and operation, only the optical sensor cell 2910 will be described hereinbelow.

The optical sensor cell 2910 includes a light source 2950, a transistor 2960, and an optical sensor 2970. In this exemplary embodiment, the light source 2950 is configured to emit light and may include an anode terminal or a first light source electrode 2950a configured to receive a supply voltage (VA). For example, the light source 2950 is an LED, a laser, a lamp, a bulb, or any suitable source of light.

The transistor 2960 includes a source terminal 2960a configured to receive a reference voltage, e.g., 0V, less than the supply voltage (VA). In an embodiment, the transistor 2960 further includes a drain terminal 2960b that serves as a cathode terminal or a second light source electrode of the light source 2950. Thus, in such an embodiment, the light source 2950 is free of a cathode terminal or a second light source electrode.

The optical sensor 2970 is configured to detect the light and to generate a sensor current, an amount of which corresponds to an amount of the light detected thereby. As shown in FIG. 29, the optical sensor 2970 includes a cathode terminal or a first optical sensor electrode 2970a configured to receive a supply voltage (Vs). For example, the optical sensor 2970 is a photodiode or any suitable sensor that detects light.

The row and column decoders 2920, 2930 are connected to the optical sensor cells and are configured to select one of the optical sensor cells, e.g., optical sensor cell 2910. The driving circuit 2940 is connected to the row and column decoders 2920, 2930 and is configured to drive, i.e., control the on/off state and the brightness of, the light source 2950 of the optical sensor cell 2910 selected by the row and column decoders 2920, 2930. The driving circuit 2940 is further configured to receive the sensor current generated by the optical sensor 2970 through an anode terminal or a second optical sensor electrode 2970b of the optical sensor 2970 and to determine an amount of light detected by the optical sensor 2970 based on the sensor current received thereby.

In an exemplary operation of the optical sensor assembly 2900, at an initial state, a gate voltage, e.g., 0V, is applied to a gate terminal 2960c of the transistor 2960. This turns the transistor 2960 off, disconnecting the drain terminal 2960b of the transistor 2960 from, e.g., the ground. As a result, the light source 2950 is turned off. At this time, the light source 2950 does not emit light. When it is desired to turn on the light source 2950, a gate voltage, e.g., substantially equal to the supply voltage (Va), is applied to the gate terminal 2960c of the transistor 2960. This turns the transistor 2960 on, connecting the drain terminal 2960b of the transistor 2960 to the ground. As a result, the light source 2950 is turned on, whereby the light source 2950 emits light. At this time, the optical sensor 2970 detects the light and generates a sensor current. The driving circuit 2940 receives the sensor current through the second optical sensor electrode 2970b of the optical sensor 2950 and determines an amount of the light based thereon.

Although the optical sensor assembly 2900 of this embodiment is exemplified as having a plurality of optical sensor cells, in an alternative embodiment, the optical sensor assembly 2900 may include one optical sensor cell. In such an alternative embodiment, the optical sensor assembly 2900 is dispensed with the row and column decoders 2920, 2930.

Figure 30:
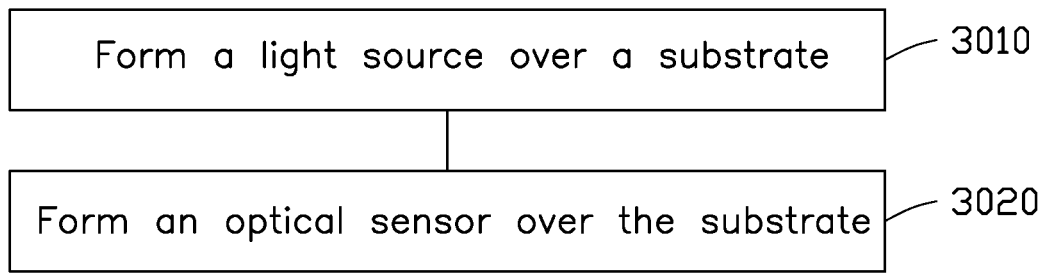
FIG. 30 is a flowchart illustrating an exemplary method of manufacturing an optical sensor cell of the optical sensor assembly according to some embodiments of the present disclosure.

FIG. 30 is a flowchart illustrating an exemplary method 3000 of manufacturing an optical sensor cell, e.g., optical sensor cell 2910 in FIG. 29, of an optical sensor assembly, e.g., optical sensor assembly 2900, according to some embodiments of the present disclosure. The method 3000 begins with block 3010 in which a light source, e.g., light source 2950, of the optical sensor cell 2910 is formed over a substrate. The method 3000 continues with block 3020 in which an optical sensor, e.g., optical sensor 2970, of the optical sensor cell 2910 is formed over the substrate. As will be described below, in an embodiment, the formation of the optical sensor is performed after the formation of the light source layer.

FIGS. 31-58 are schematic sectional views illustrating various stages of the manufacturing of an optical sensor cell, e.g., optical sensor cell 2910 in FIG. 29, of an optical sensor assembly, e.g., optical sensor assembly 2900, according to some embodiments of the present disclosure.

Figure 31:
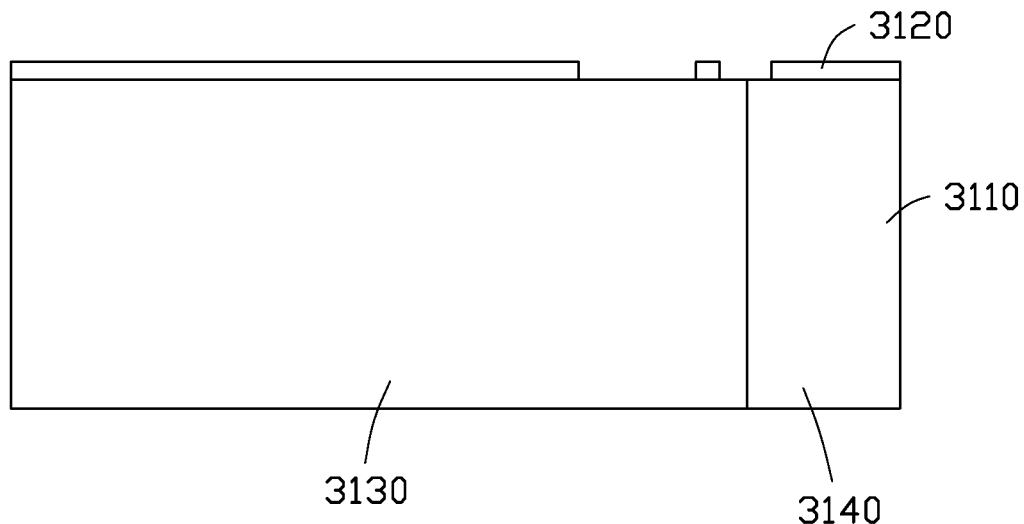
FIGS. 31-58 are schematic sectional views illustrating various stages in the manufacturing of the optical sensor cell according to some embodiments of the present disclosure.

FIG. 31 is a schematic sectional view of a stage in the manufacturing of the optical sensor cell 2910 according to some embodiments of the present disclosure. FIG. 3 illustrates a structure after a substrate 3110 that includes a patterned dielectric layer 3120 on a top surface thereof is provided. The substrate 3110 may be a semiconductor substrate, such as a bulk semiconductor substrate, an SOI substrate, a multi-layered or gradient substrate, or the like. The substrate 3110 may be doped or undoped and include a semiconductor material, such as an elemental semiconductor including Si, Ge, a compound or alloy semiconductor including SiGe, SiC, GaAs, GaP, GaAsP, AlInAs, AlGaAs, GaInAs, InAs, GaInP, InP, InSb, GaInAsP, and the like. In this exemplary embodiment, the substrate 3110 is a bulk silicon substrate and the top surface of the substrate 3110 has a (100) facet.

As shown in FIG. 31, the substrate 3110 includes a first well region 3130 of a first conductivity type, e.g., p-type, and a second well region 3140 of a second conductivity type, e.g., n-type, opposite the first conductivity type. For example, the formation of the first and second well regions 3130, 3140 includes: depositing a first mask layer over the substrate 3110; patterning the first mask layer; implanting impurities of the first conductivity type, such as B, Ga, Al, and the like, in a portion of the substrate 3110 exposed by the first mask layer, whereby the first well region 3130 is formed therein; removing the first mask layer; depositing a second mask layer over the substrate 3110; patterning the second mask layer; implanting impurities of the second conductivity type, such as P, Sb, As, and the like, in another portion of the substrate 3110 exposed by the second mask layer, whereby the second well region 3140 is formed therein; and removing the second mask layer.

The dielectric layer 3120 may be formed by oxidizing the top surface of the substrate 3110, such as by a thermal oxidation, chemical oxidation, any suitable oxidation process, or a combination thereof. In an alternative embodiment, the dielectric layer 3120 is formed by depositing a dielectric material on the top surface of the substrate 3110, such as by a CVD, a PVD, an ALD, variations/derivatives thereof, any suitable deposition technique, or a combination thereof. Examples of materials for the dielectric layer 3120 include, but are not limited to, $SiO_2$, SiN, SiON, SiCN, and SiOCN. The dielectric layer 3120 may have a thickness of less than about 100 nm. The dielectric layer 3120 may be patterned using, e.g., an electron beam lithography.

Figure 32:
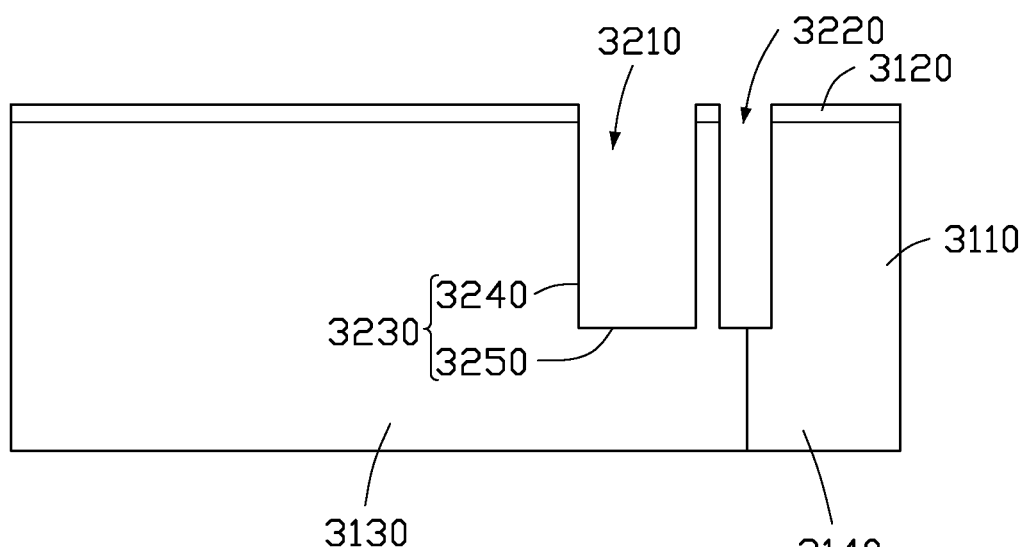

FIG. 32 is a schematic sectional view of another stage in the manufacturing of the optical sensor cell 2910 according to some embodiments of the present disclosure. FIG. 32 illustrates a structure after first and second holes 3210, 3220 are formed in the substrate 3110. As will be described below, a light source, e.g., light source 2950 in FIG. 29, may be formed in the first hole 3120. An isolation region, e.g., a shallow trench isolation (STI) region, may be formed in the second hole 3220. For example, the holes 3210, 3220 are formed by a wet or dry etching process, e.g., an RIE process, an NBE process, and the like or a combination thereof, using the dielectric layer 3120 as a mask.

As shown in FIG. 32, the first hole 3110 has a substantially rectangular cross-section and is defined by a hole-defining wall 3230 that includes a wall surface 3240 and a bottom surface 3250. The wall surface 3240 extends upwardly from a periphery of the bottom surface 3250 and is substantially perpendicular to the top surface of the substrate 3110. In an exemplary embodiment, the first hole 3210 has a depth, i.e., the wall surface 3240 of the hole-defining wall 3230 has a height, of about 100 nm to about 700 nm, e.g., about 500 nm. In such an exemplary embodiment, the bottom surface 3250 of the hole-defining wall 3230 has a width of about 100 nm to about 700 nm, e.g., 500 nm.

Figure 33:
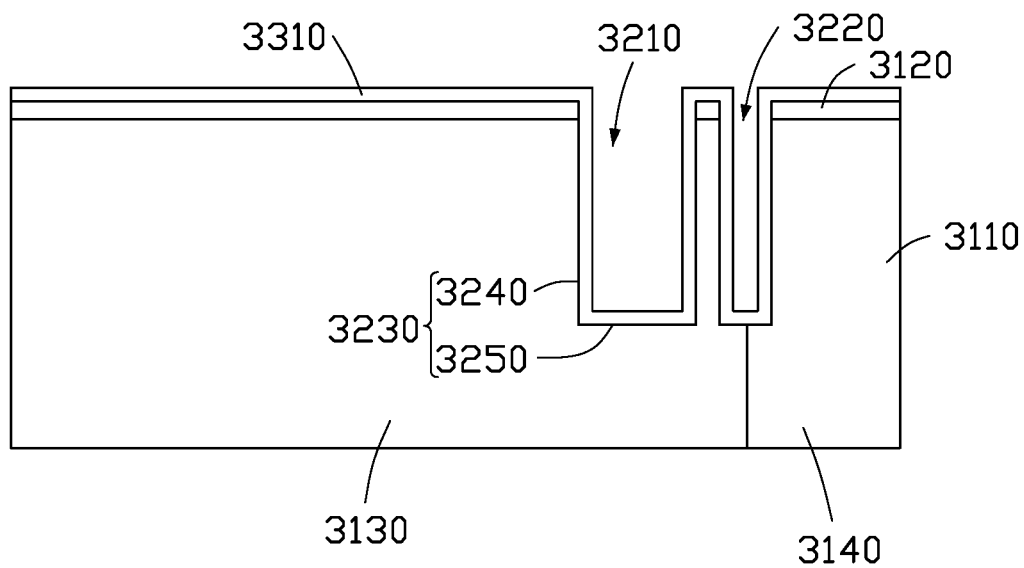

FIG. 33 is a schematic sectional view of another stage in the manufacturing of the optical sensor cell 2910 according to some embodiments of the present disclosure. FIG. 33 illustrates a structure after a blocking layer 3310 is conformally formed in the holes 3210, 3220. That is, a thickness of the blocking layer 3310 on the wall surface 3240 of the hole-defining wall 3230 is substantially the same as a thickness of the blocking layer 3310 on the bottom surface 3250 of the hole-defining wall 3230. As shown in FIG. 33, in some embodiments, the second hole 3220 is partially filled with the blocking layer 3310. In other embodiments, the second hole 3220 may be completely filled or overfilled with the blocking layer 3310. For example, the blocking layer 3310 is formed using CVD, PVD, ALD, their derivatives, e.g., PECVD, HDP-CVD, FCVD, any suitable deposition technique, or a combination thereof. The blocking layer 3310 may include a nitride-based material, such as SiN, SiCN, SiON, SiOCN, and the like, or an oxide-based material, such as $SiO_2$. In some embodiments, the blocking layer 3310 has a thickness of about 100 nm to about 300, e.g., 200 nm. In other embodiments, the blocking layer 3310 has a thickness of about 150 nm to about 250 nm, e.g., 200 nm.

Figure 34:
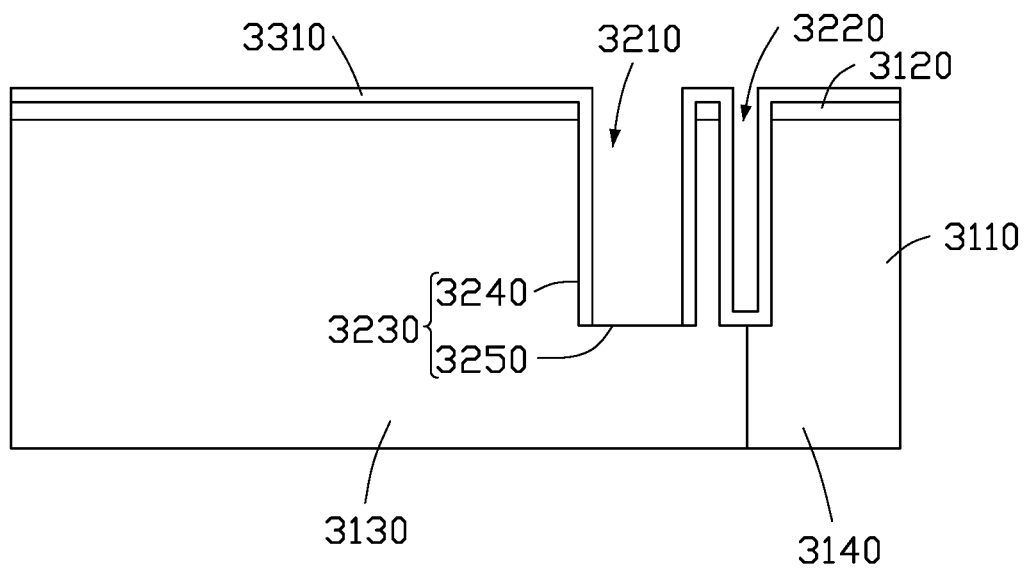

FIG. 34 is a schematic sectional view of another stage in the manufacturing of the optical sensor cell 2910 according to some embodiments of the present disclosure. FIG. 34 illustrates a structure after the blocking layer 3310 on the bottom surface 3250 of the hole-defining wall 3230 is removed, exposing the bottom surface 3250 of the hole-defining wall 3230. As shown in FIG. 34, the blocking layer 3310 remains in the second hole 3320.

In some embodiments, the blocking layer 3310 on the bottom surface 3250 of the hole-defining wall 3230 is removed using an ICP etching process, an RIE process, any suitable dry etching process, or a combination thereof. In other embodiments, the blocking layer 3310 on the bottom surface 3250 of the hole-defining wall 3230 is removed by a wet etching process or a combination of wet and dry etching processes.

Figure 35:
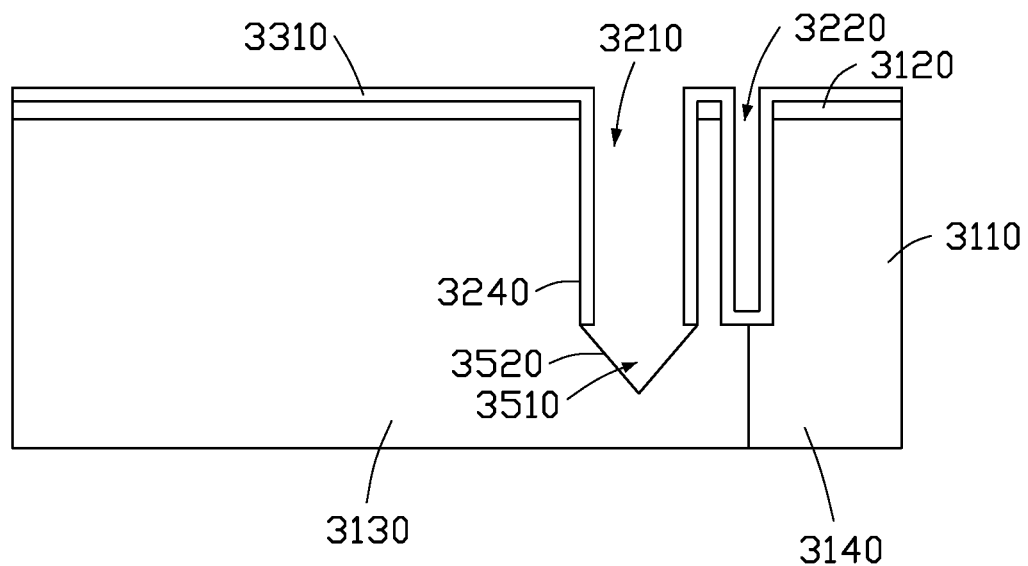

FIG. 35 is a schematic sectional view of another stage in the manufacturing of the optical sensor cell 2910 according to some embodiments of the present disclosure. FIG. 35 illustrates a structure after a groove 3510 is formed in the substrate 3110. In some embodiments, the groove 3510 is formed in the substrate 3110 by performing a wet etching on the bottom surface (labeled 3250 in FIG. 34) exposed by the blocking layer 3310. In such some embodiments, the wet etching process is performed using an etching solution, e.g., KOH, heated to from about 70° C. to about 90° C., e.g., 80° C., for about 100 seconds to about 120 seconds, e.g., about 110 seconds. In other embodiments, the bottom surface 3250 may be etched using a dry etching process or a combination of wet and dry etching processes.

As shown in FIG. 35, the groove 3510 has a substantially triangular cross-section and is defined by a groove-defining wall 3520. The groove-defining wall 3520 tapers toward a bottom surface of the substrate 3110 and includes opposite inclined surfaces, each of which has a (111) facet.

Figure 36:
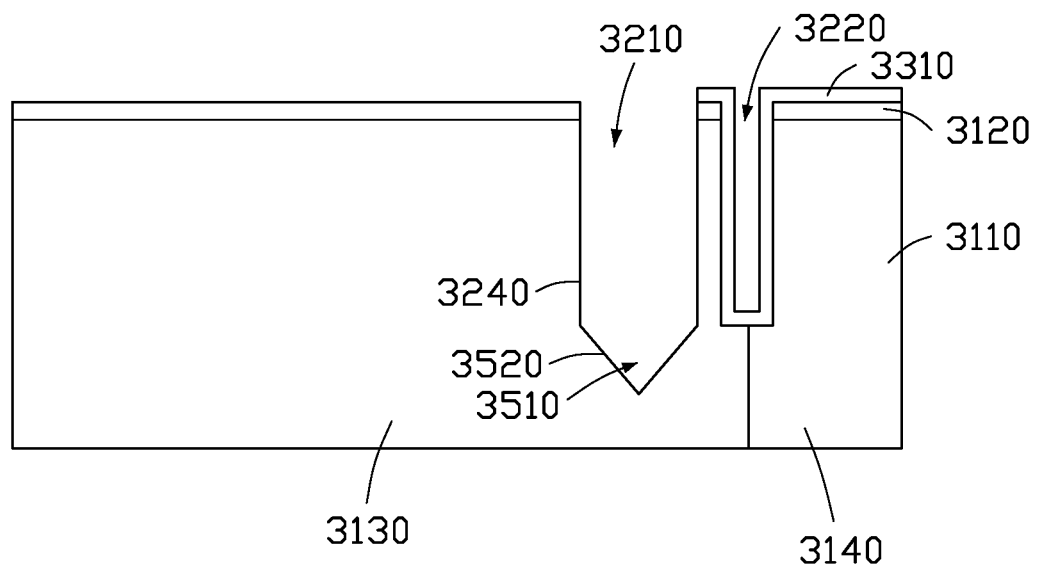

FIG. 36 is a schematic sectional view of another stage in the manufacturing of the optical sensor cell 2910 according to some embodiments of the present disclosure. FIG. 36 illustrates a structure after the blocking layer 3310 on the wall surface 3240 is removed, using an ICP etching process, an RIE process, any suitable dry etching process, or a combination thereof. In an alternative embodiment, the blocking layer 3310 on the wall surface 3240 is removed by a wet etching process or a combination of wet and dry etching processes. As shown in FIG. 36, the blocking layer 3310 remains in the second hole 3220.

Figure 37:
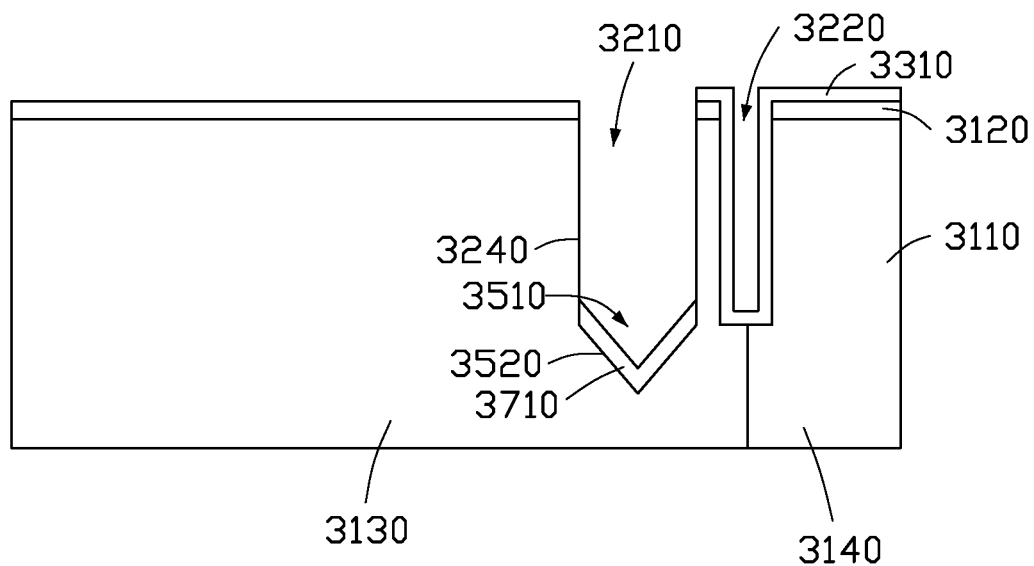

FIG. 37 is a schematic sectional view of another stage in the manufacturing of the optical sensor cell 2910 according to some embodiments of the present disclosure. FIG. 37 illustrates a structure after a buffer layer 3710 is formed on the groove-defining wall 3520. The buffer layer 3710 may have a thickness of about 100 nm to about 500 nm, e.g., about 200 nm. Examples of materials for the buffer layer 3710 include, but are not limited to, MN, TiN, TaN, HfN, and ZrN. For example, the buffer layer 3710 is formed using CVD, PVD, ALD, their derivatives, such as MOCVD, any suitable deposition technique, or a combination thereof.

Figure 38:
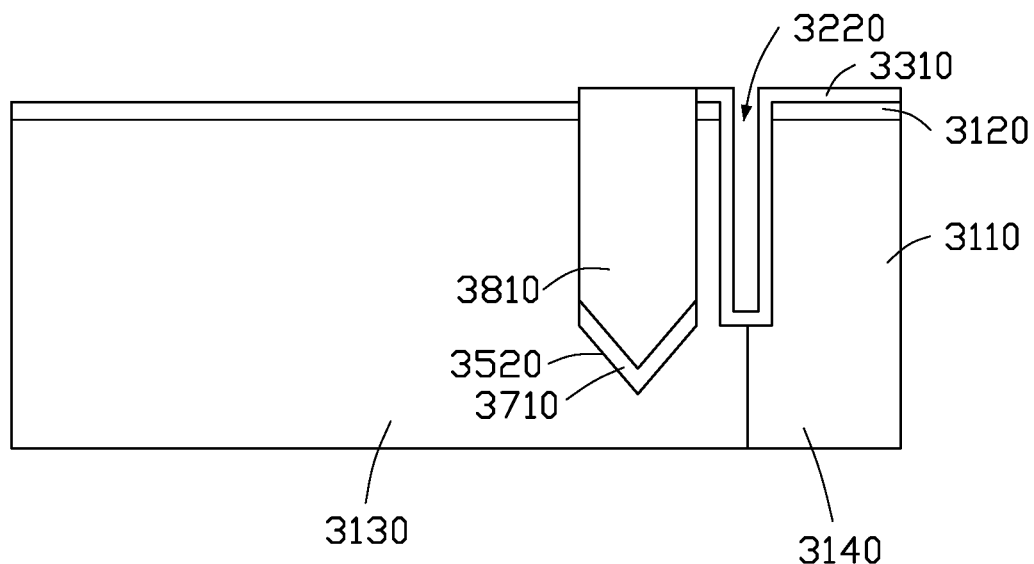

FIG. 38 is a schematic sectional view of another stage in the manufacturing of the optical sensor cell 2910 according to some embodiments of the present disclosure. FIG. 38 illustrates a structure after a first light source layer 3810 of a light source, e.g., light source 2950 in FIG. 1, of the optical sensor cell 2910 is formed over the buffer layer 3710. In this exemplary embodiment, the formation of the first light source layer 3810 includes: growing a III-V compound semiconductor on the buffer layer 3710; implanting the III-V compound semiconductor with n-type impurities; and doping the III-V compound semiconductor with dopants, e.g., silicon.

The first light source layer 3810 is grown such that the III-V compound semiconductor, e.g., GaN, transitions from a hexagonal III-V compound semiconductor, e.g., h-GaN, i.e., at a lower portion of the first light source layer 3810, to a cubic III-V compound semiconductor, e.g., c-GaN, i.e., at an upper portion of the first light source layer 3810. The upper portion of the first light source layer 3810, i.e., the cubic III-V compound semiconductor, includes a top surface that has a facet, e.g. (100), the same as the facet of the top surface of the substrate 3110.

Although the III-V compound semiconductor of the first light source layer 3810 is exemplified as GaN, the III-V compound semiconductor of the first light source layer 3810 may include InP, InAs, GaAs, InSb, or any suitable alloy of two or more III-V compound semiconductors.

Figure 39:
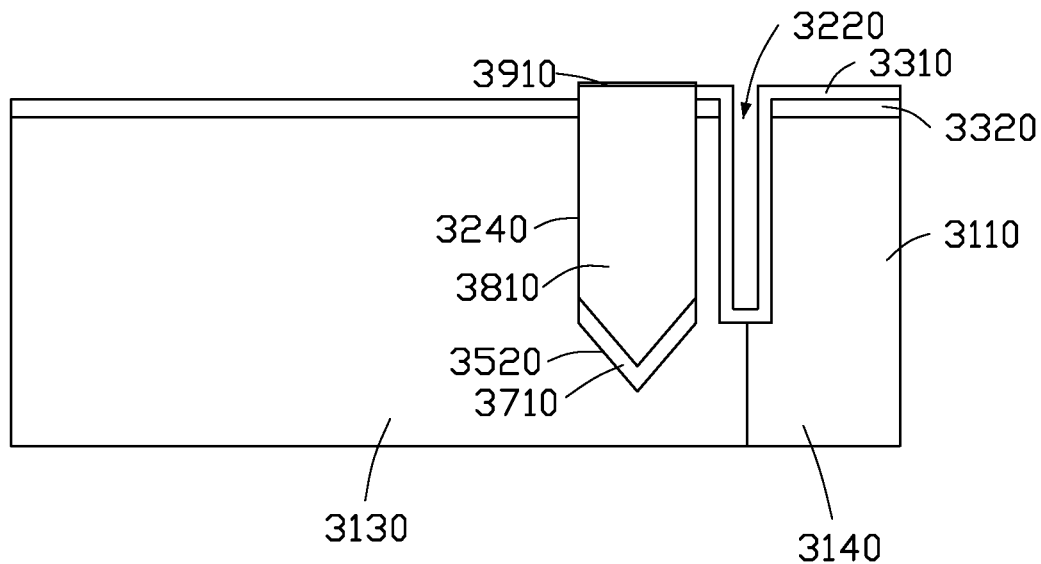

FIG. 39 is a schematic sectional view of another stage in the manufacturing of the optical sensor cell 2910 according to some embodiments of the present disclosure. FIG. 39 illustrates a structure after a light-generating layer 3910 of the light source 2950 is formed over the first light source layer 3810. In some embodiments, the light-generating layer 3910 includes an SQW. In other embodiments, the light-generating layer 3910 includes an MQW. In such other embodiments, the light-generating layer 3910 may include a plurality of alternating well layers, e.g., GaN, and barrier layers, e.g., AlGaN. The light-generating layer 3910 may be grown on the first light source layer 3810 using CVD, PVD, ALD, their derivatives, such as MOCVD, any suitable deposition technique, or a combination thereof.

Figure 40:
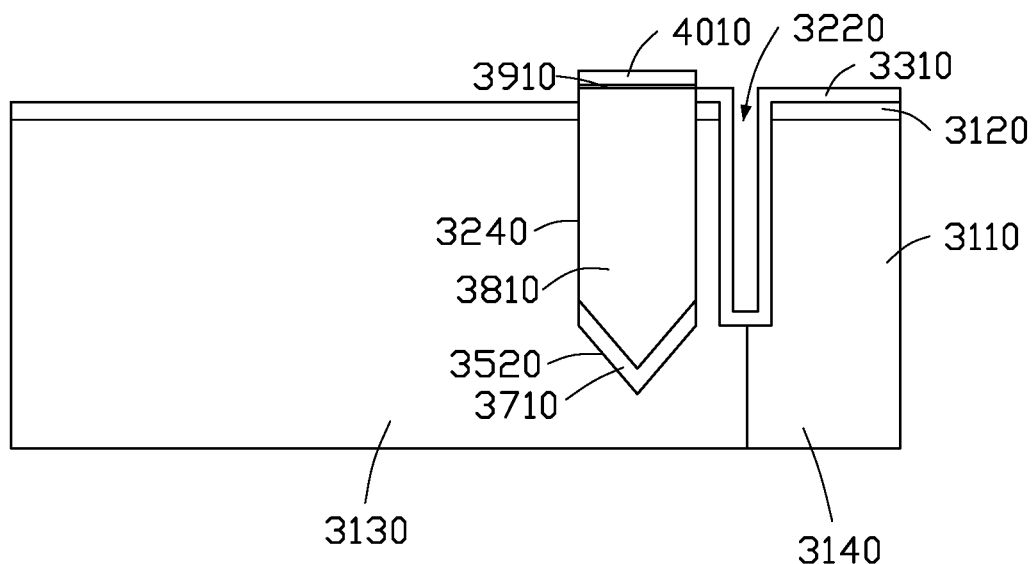

FIG. 40 is a schematic sectional view of another stage in the manufacturing of the optical sensor cell 2910 according to some embodiments of the present disclosure. FIG. 40 illustrates a structure after a second light source layer 4010 of the light source 2950 is formed over the light-generating layer 3910. For example, the formation of the second light source layer 4010 includes growing a III-V compound semiconductor, e.g., GaN, on the light-generating layer 3910 and implanting the III-V compound semiconductor with p-type impurities. In some embodiments, the second light source layer 4010 includes GaN. In other embodiments, the second light source layer 4010 includes InP, InAs, GaAs, InSb, or any suitable alloy of two or more III-V compound semiconductor. The second light source layer 4010 may have a thickness of about 100 nm to about 500 nm, e.g., about 150 nm.

Figure 41:
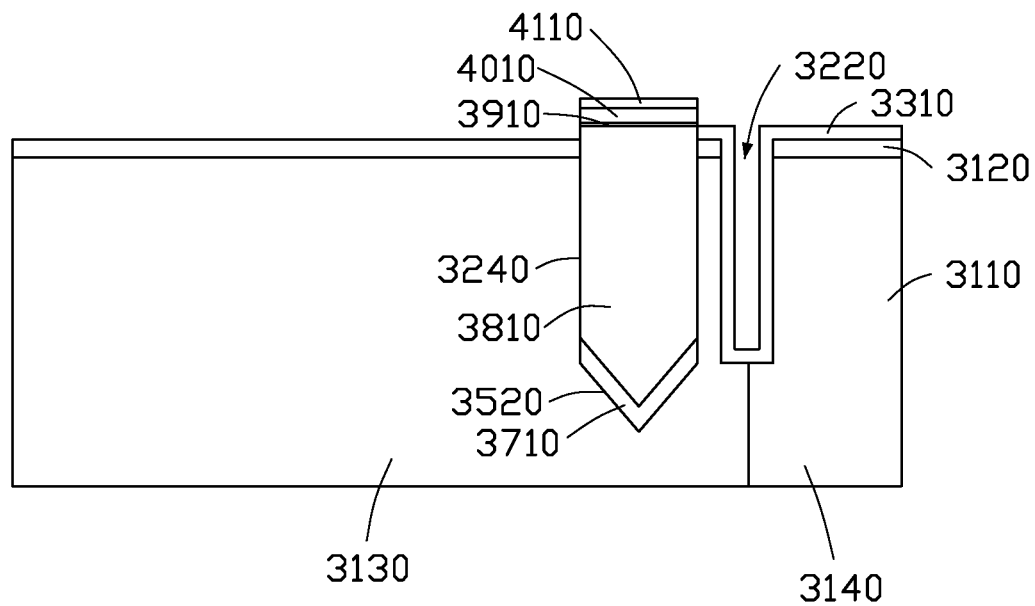

FIG. 41 is a schematic sectional view of another stage in the manufacturing of the optical sensor cell 2910 according to some embodiments of the present disclosure. FIG. 41 illustrates a structure after a current spreading layer 4110 is formed over the second light source layer 4010. For example, the formation of the current spreading layer 4110 includes: depositing a photoresist layer over the structure of FIG. 40; patterning the photoresist layer to expose a top surface of the second light source layer 4010; depositing a TCL on the top surface of the second light source layer 4010 exposed by the photoresist layer; and removing the photoresist layer. Examples of materials for the TCL include, but are not limited to, Ni, Au, Ag, Pt, and Pd, metal oxides such as IZO, InO, ZnO, ITO, SnO, ATO, SbO, AZO, CTO, and CdO, and metal nitrides such as TiN, WN, and TiWN. The current spreading layer 4110 may have a thickness of about 10 nm to about 100 nm.

Figure 42:
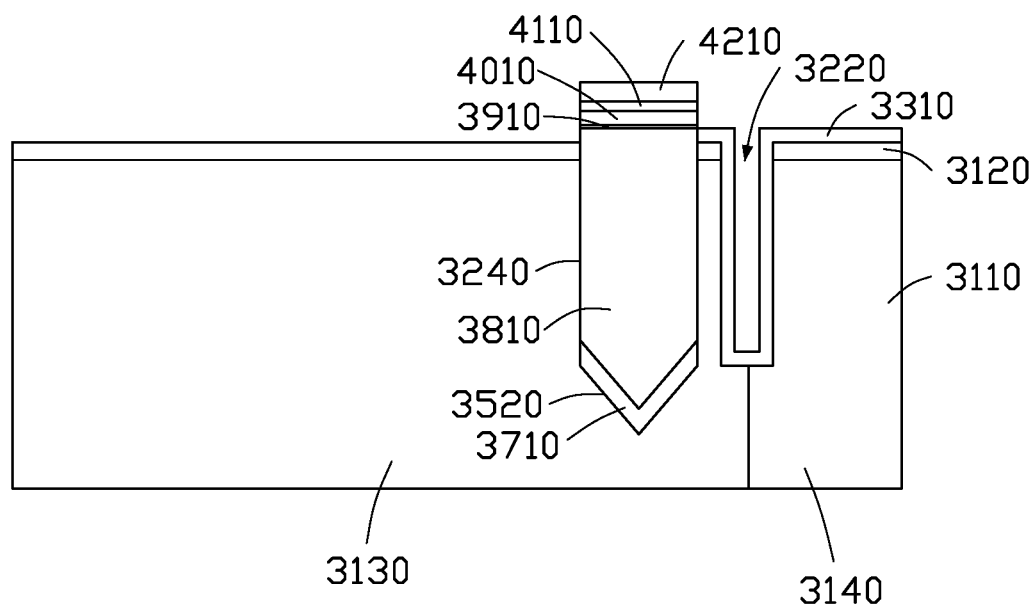

FIG. 42 is a schematic sectional view of another stage in the manufacturing of the optical sensor cell 2910 according to some embodiments of the present disclosure. FIG. 42 illustrates a structure after a light reflecting layer 4210 is formed over the current spreading layer 4110. The light reflecting layer 4210 is configured to direct light emitted by the light source 2950 through a sidewall of the light source 2950, improving detection of the light by an optical sensor, e.g., optical sensor 2970 in FIG. 1. In some embodiments, the light reflecting layer 4210 is a dielectric mirror, e.g., a distributed Bragg reflector (DBR). In such some embodiments, the formation of the light reflecting layer 4210 includes depositing alternating layers of dielectric materials having different refractive indices, e.g., oxides and nitrides, on a top surface of the current spreading layer 4110. In other embodiments, the light reflecting layer 4210 is a metallic mirror, a crystalline mirror, or a hybrid mirror, i.e., a combination of at least two of the dielectric mirror, the metallic mirror, and the crystalline mirror.

Figure 43:
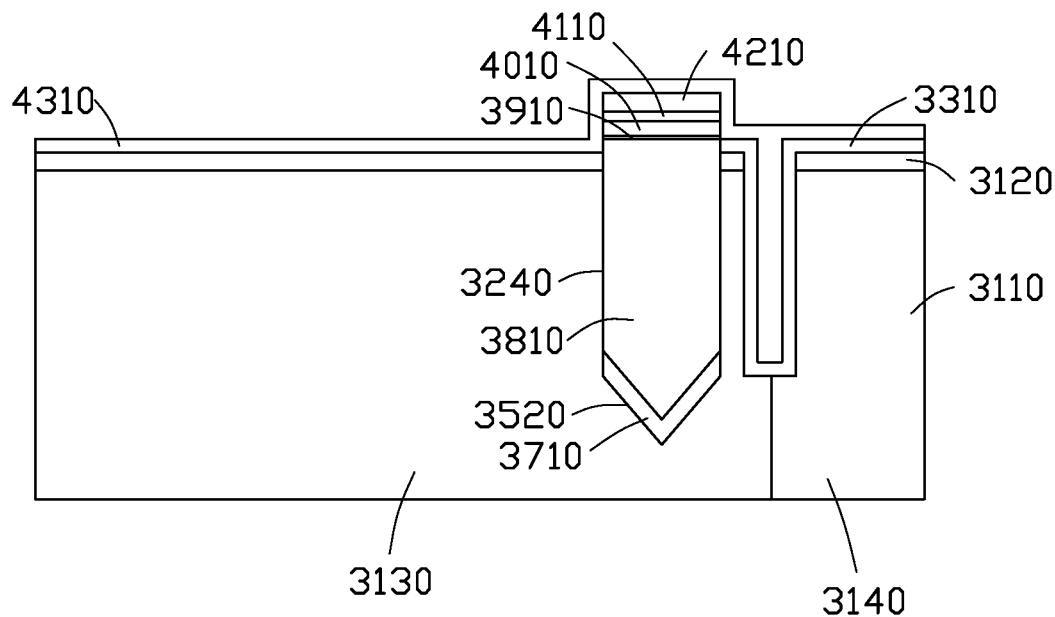

FIG. 43 is a schematic sectional view of another stage in the manufacturing of the optical sensor cell 2910 according to some embodiments of the present disclosure. FIG. 43 illustrates a structure after a protection layer 4310 is formed over the structure of FIG. 42. As shown in FIG. 42, in some embodiments, the second hole (labeled 3220 in FIG. 42) is filled with the protection layer 4310. In other embodiments, the second hole 3220 may be partially filled with the protection layer 4310. Examples of materials for the protection layer 4310 include, but are not limited to, $SiO_2$, SiN, SiON, SiCN, and SiOCN. As will be apparent hereinbelow, after reading the present disclosure, the protection layer 4310 is configured to prevent damage to the light source 2950 during subsequent processes of forming a transistor, e.g., transistor 2960 in FIG. 29.

Figure 44:
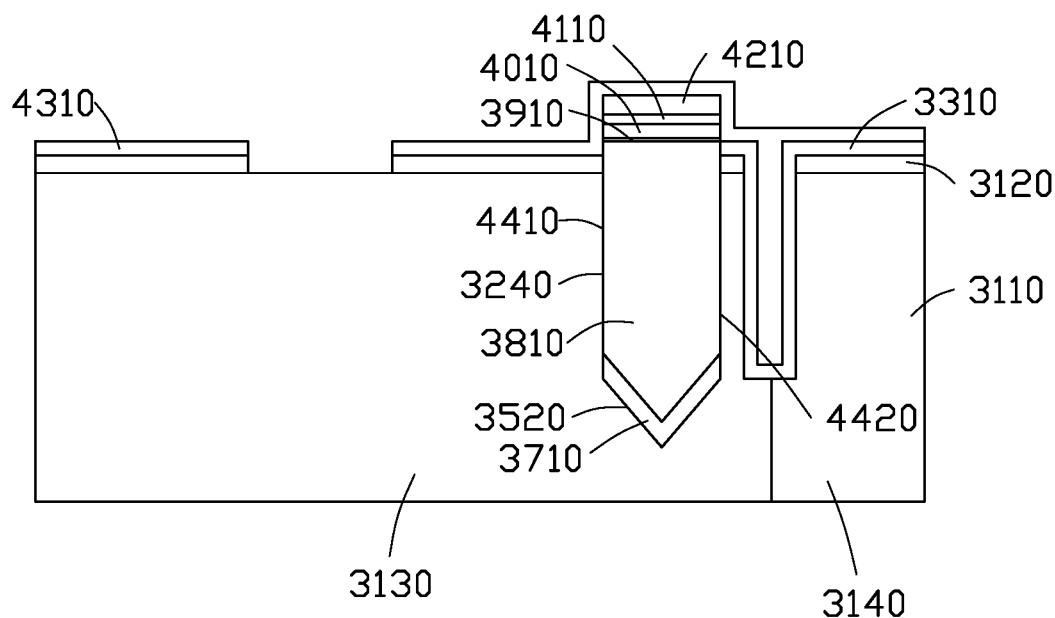

FIG. 44 is a schematic sectional view of another stage in the manufacturing of the optical sensor cell 2910 according to some embodiments of the present disclosure. FIG. 44 illustrates a structure after the layers 3120, 4310 are removed, such as by a wet or dry etching process or a combination thereof, exposing the top surface of the first well region 3130 of the substrate 3110 adjacent a first sidewall 4410 of the first light source layer 3810. As shown in FIG. 44, the layers 3120, 3310, 4310 remain on the top surface of the first well region 3130 of the substrate 3110 adjacent a second sidewall 4420 of the first light source layer 3810 opposite the first sidewall 4410 of the first light source layer 3810.

Figure 45:
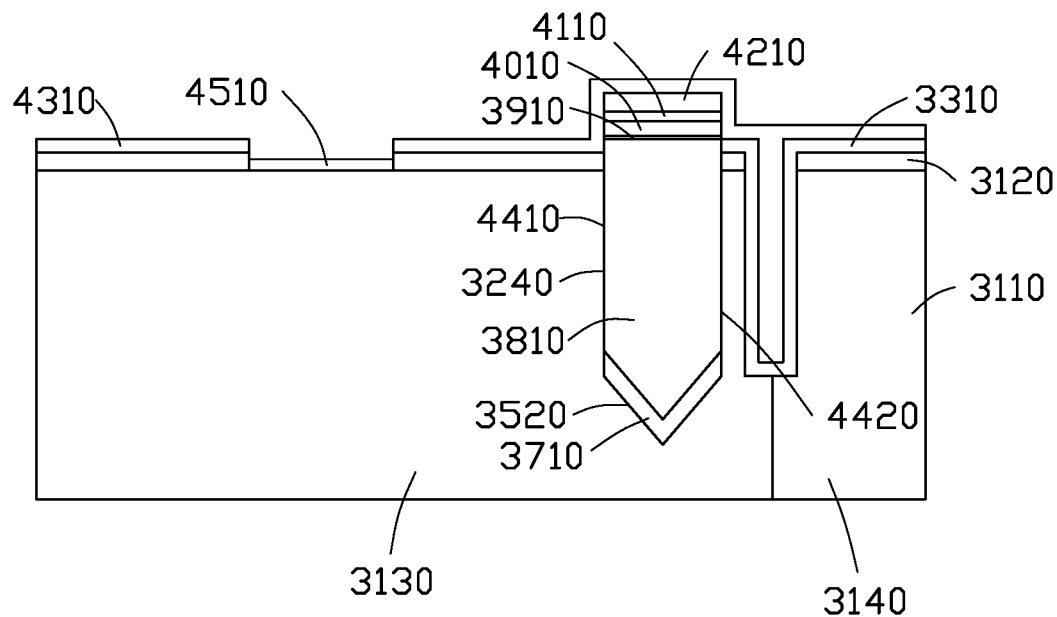

FIG. 45 is a schematic sectional view of another stage in the manufacturing of the optical sensor cell 2910 according to some embodiments of the present disclosure. FIG. 45 illustrates a structure after a gate dielectric 4510 of the transistor 2960 is formed over the top surface of the first well region 3130 of the substrate 3110 exposed by the layers 3120, 4310. The gate dielectric 4510 may include a dielectric material that has a dielectric constant from about 4, e.g., $SiO_2$, to about 8, e.g., SiN. Alternatively, the gate dielectric 4510 may include a higher dielectric constant dielectric material having a dielectric constant greater than about 8. Such a higher dielectric constant dielectric material may include HfO, HfSiO, HfZrO, TaO, ZrO, ZrSiO. LaO, AlO, TiO, YO, STO, BTO, BST, BaZrO, HfZrO, HfLaO, LaSiO, AlSiO, HfTaO, HfTiO, PZT, and the like.

Figure 46:
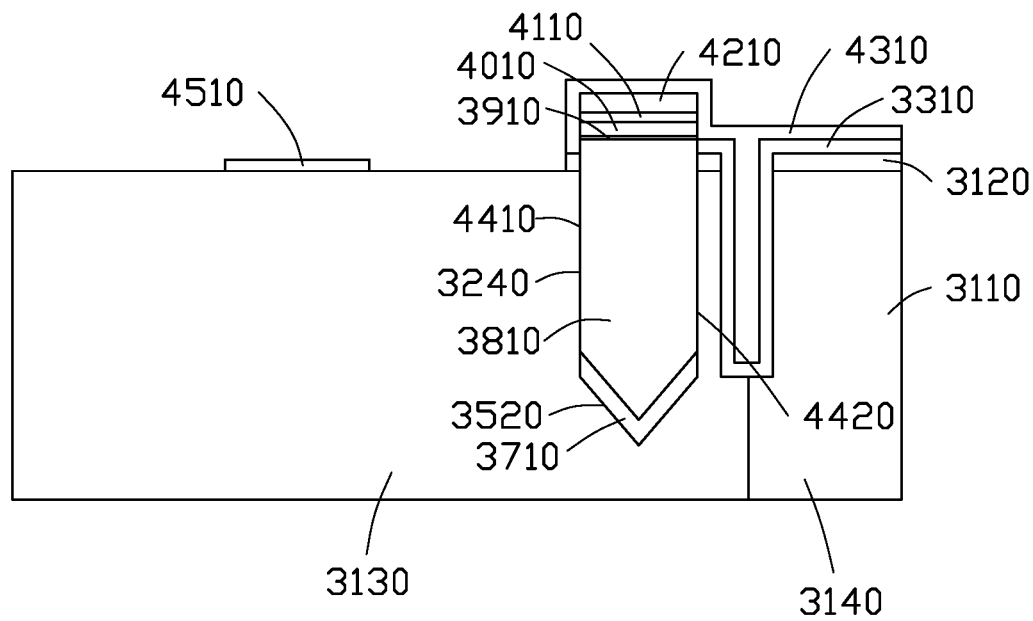

FIG. 46 is a schematic sectional view of another stage in the manufacturing of the optical sensor cell 2910 according to some embodiments of the present disclosure. FIG. 46 illustrates a structure after the layers 3120, 4310 on the top surface of the first well region 3130 of the substrate 3110 adjacent the first sidewall 4410 of the first light source layer 3810 are removed, such as by a wet or dry etching process or a combination thereof. As shown in FIG. 46, the layer 4310 remains on a top surface of the light reflecting layer 4210.

Figure 47:
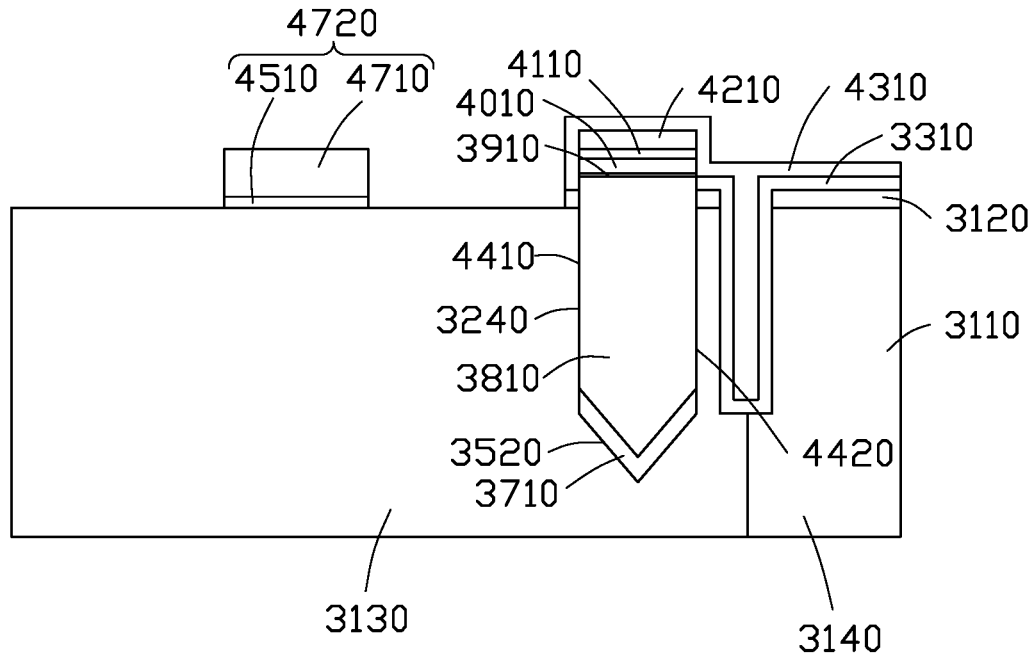

FIG. 47 is a schematic sectional view of another stage in the manufacturing of the optical sensor cell 2910 according to some embodiments of the present disclosure. FIG. 47 illustrates a structure after a gate electrode 4710 is formed over the gate dielectric 4510. For example, the gate electrode 4710 is formed by first depositing a gate material using CVD, PVD, ALD, their derivatives, any suitable deposition technique, or a combination thereof, on the gate dielectric 4510 and then by planarizing the deposited gate material using a CMP technique. In some embodiments, the gate electrode 4710 includes polysilicon. In other embodiments, the gate electrode 4710 is a metal gate. Examples of materials for the metal gate include, but are not limited to, Ti, TiN, TiAl, Al, AlN, Ta, TaN, TaC, TaCN, TaSiN, and TaSi.

In certain embodiments, the gate electrode 4710 includes a gate metal layer and a work function metal layer, e.g., liner layer, wetting layer, adhesion layer, metal alloy, and metal silicide. The gate dielectric 4510 and the gate electrode 4710 constitute a gate structure 4720.

Figure 48:
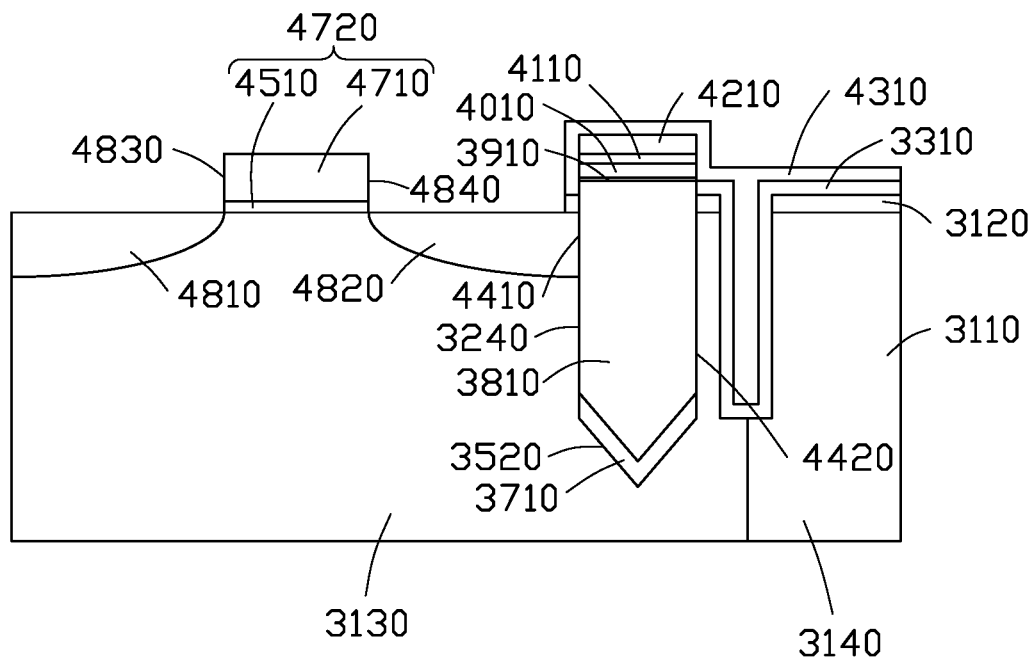

FIG. 48 is a schematic sectional view of another stage in the manufacturing of the optical sensor cell 2910 according to some embodiments of the present disclosure. FIG. 48 illustrates a structure after lightly doped source/drain regions 4810, 4820 of the transistor 2960 are formed adjacent first and second sidewalls 4830, 4840 of the gate structure 4720, respectively. The lightly doped source/drain regions 4810, 4820 may be formed by implanting n-type dopants in the first well region 3130 of the substrate 3110 using the gate structure 4720 as a mask. Examples of materials for the n-type dopants include, but are not limited to, P, As, and Sb.

Figure 49:
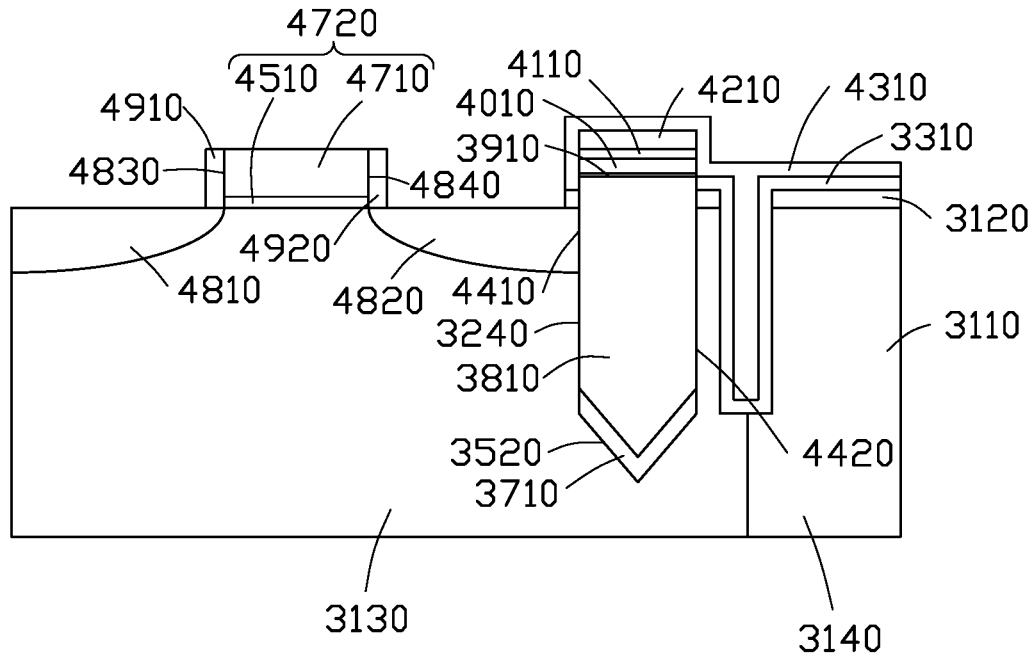

FIG. 49 is a schematic sectional view of another stage in the manufacturing of the optical sensor cell 2910 according to some embodiments of the present disclosure. FIG. 49 illustrates a structure after gate spacers 4910, 4920 are formed on the first and second sidewalls 4830, 4840 of the gate structure 4720, respectively. Each of the gate spacers 4910, 4920 may include a plurality of spacer layers, such as main spacer layer, liner layers, and the like. In this exemplary embodiment, the gate spacers 4910, 4920 are formed by depositing a spacer material, such as $SiO_2$, SiN, SiC, SiON, or the like, on the gate structure 4720 and etching back the deposited spacer material using a wet or dry etching process or a combination thereof.

Figure 50:
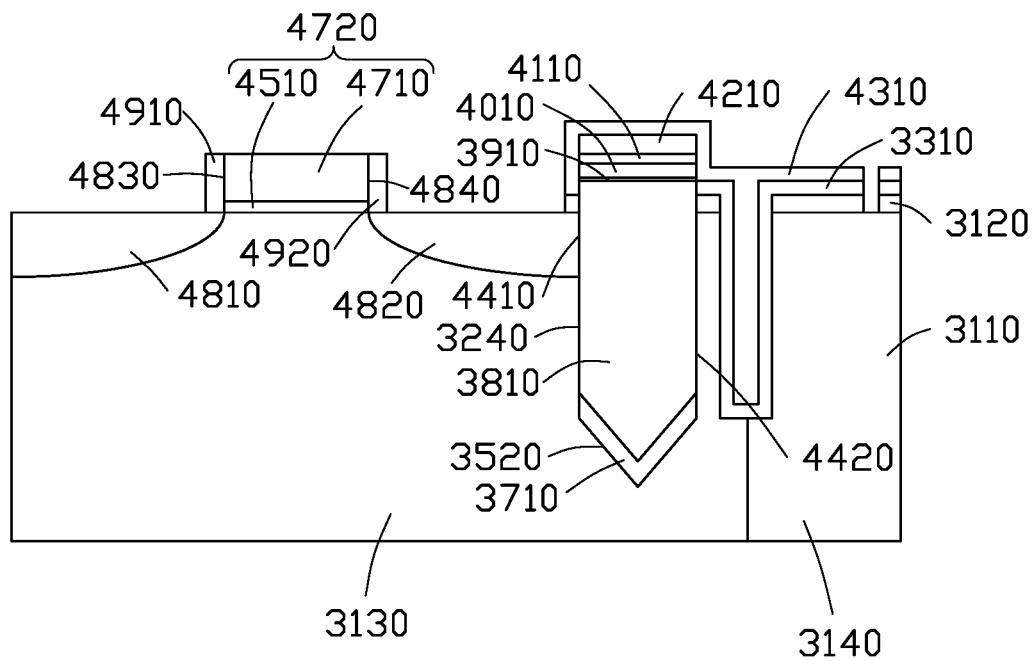

FIG. 50 is a schematic sectional view of another stage in the manufacturing of the optical sensor cell 2910 according to some embodiments of the present disclosure. FIG. 50 illustrates a structure after the layers 3120, 3310, 4310 are removed, such as by a wet or dry etching process or a combination thereof, exposing the top surface of the second well region 3140 of the substrate 3110.

Figure 51:
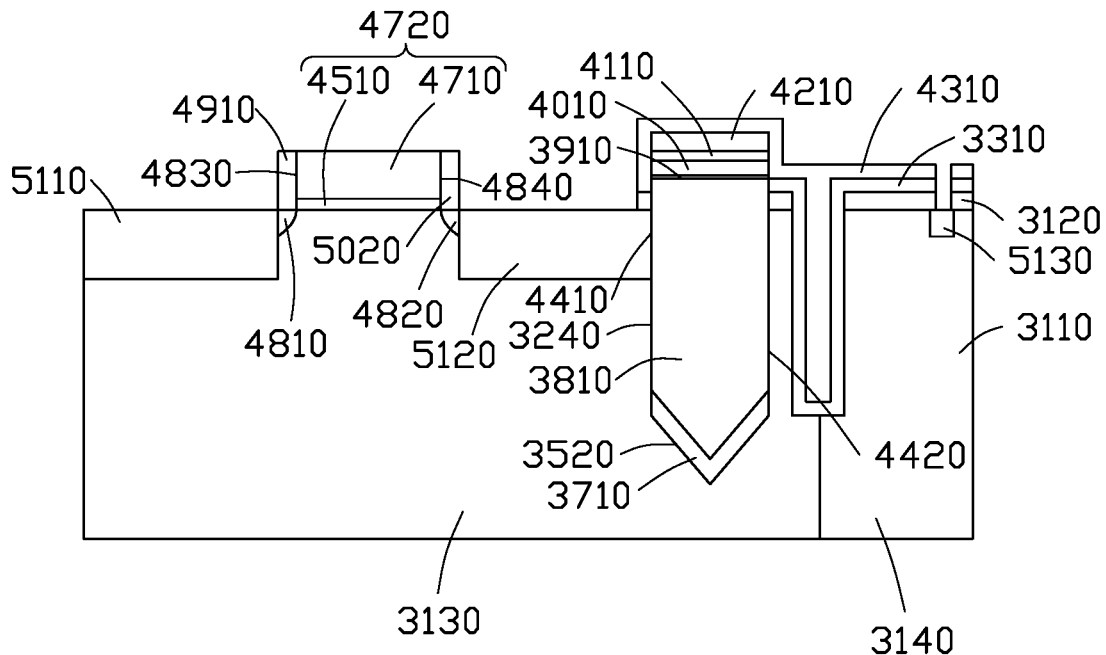

FIG. 51 is a schematic sectional view of another stage in the manufacturing of the optical sensor cell 2910 according to some embodiments of the present disclosure. FIG. 51 illustrates a structure after source and drain regions 5110, 5120 of the transistor 2960 and the first optical sensor region 5130 of an optical sensor, e.g., optical sensor 2970 in FIG. 1, are formed in the substrate 3110. In this exemplary embodiment, the regions 5110-5130 are formed by simultaneously and respectively implanting impurities of the second conductivity type, e.g., n-type dopants, in the first and second well regions 3130, 3140 of the substrate 3110 using the protection layer 4310 as a mask.

The first optical sensor region 5130 has a greater dopant concentration than the second well region 3140 and substantially the same dopant concentration as the source/drain region 5110/5120.

Although the source and drain regions 5110, 5120 are exemplified as implanted source and drain regions, in an alternative embodiment, the source and drain regions may be raised source and drain regions. In such an alternative embodiment, the formation of the raised source and drain regions includes: etching the substrate 3110 to form a trench therein; growing epitaxial layer in the trench in the substrate 3110; and doping the epitaxial layer with n-type impurities. The source and drain regions 5110, 5120 may include Si, SiC, SiCP, and the like.

Figure 52:
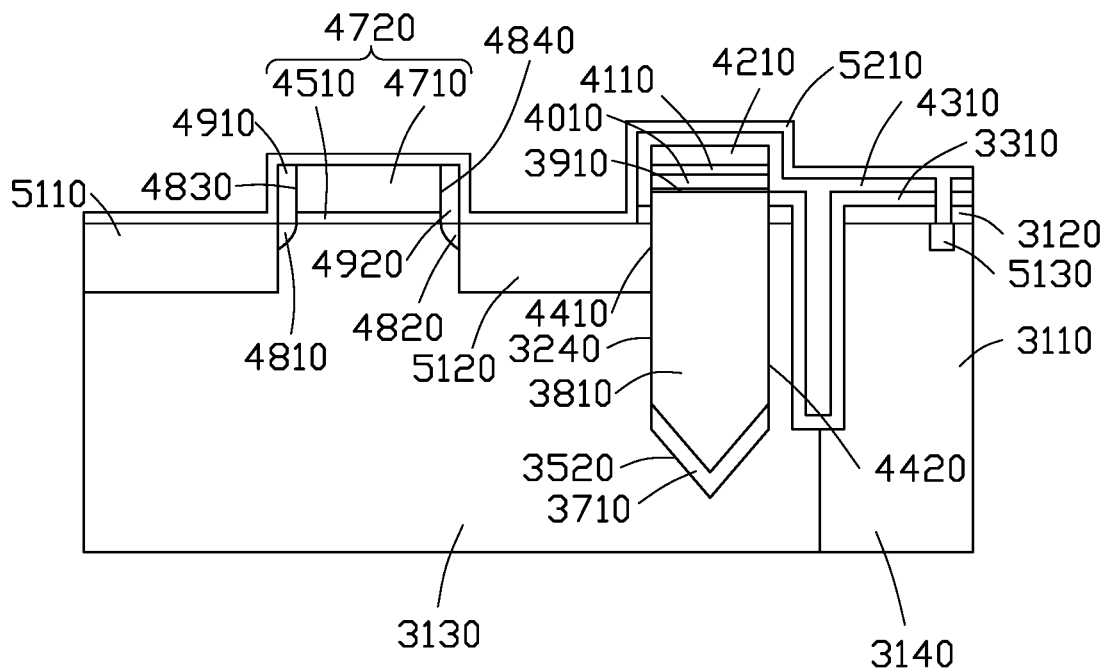

FIG. 52 is a schematic sectional view of another stage in the manufacturing of the optical sensor cell 2910 according to some embodiments of the present disclosure. FIG. 52 illustrates a structure after a protection layer 5210 is formed over the structure of FIG. 51, such as by a CVD, a PVD, an ALD, derivatives thereof, any suitable deposition technique, or a combination thereof. Examples of materials for the protection layer 5210 include, but are not limited to, SiO$_2$, SiN, SiON, SiCN, and SiOCN.

Figure 53:
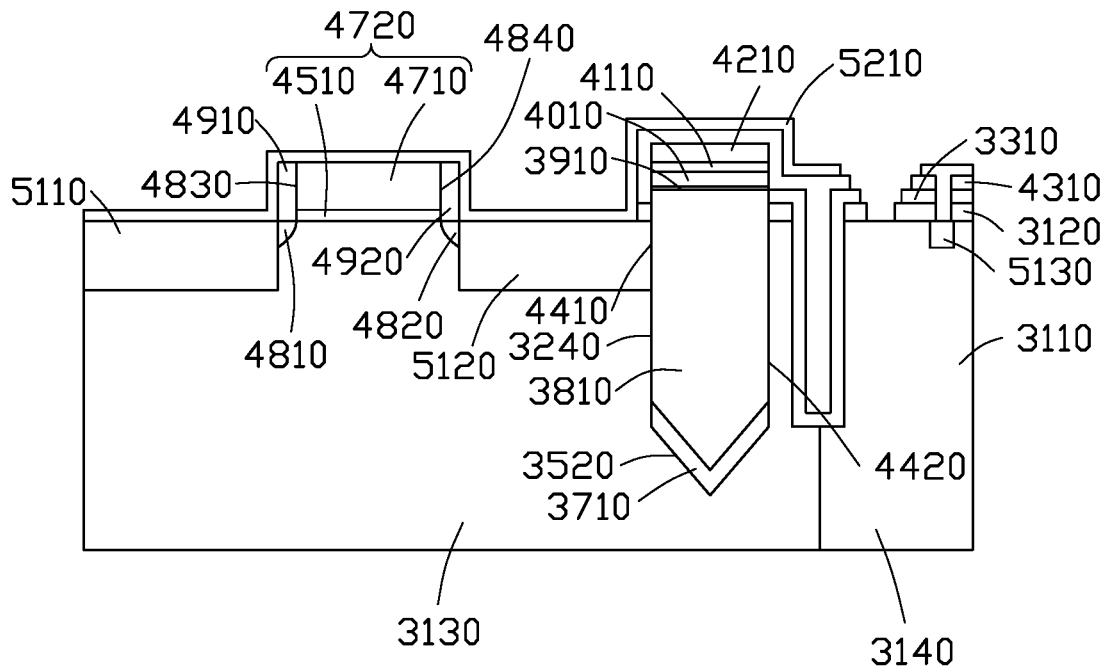

FIG. 53 is a schematic sectional view of another stage in the manufacturing of the optical sensor cell 2910 according to some embodiments of the present disclosure. FIG. 53 illustrates a structure after the layers 3120, 3310, 4310, 5210 are removed, such as by a wet or dry etching process or a combination thereof, exposing the second well region 3140 of the substrate 3110.

Figure 54:
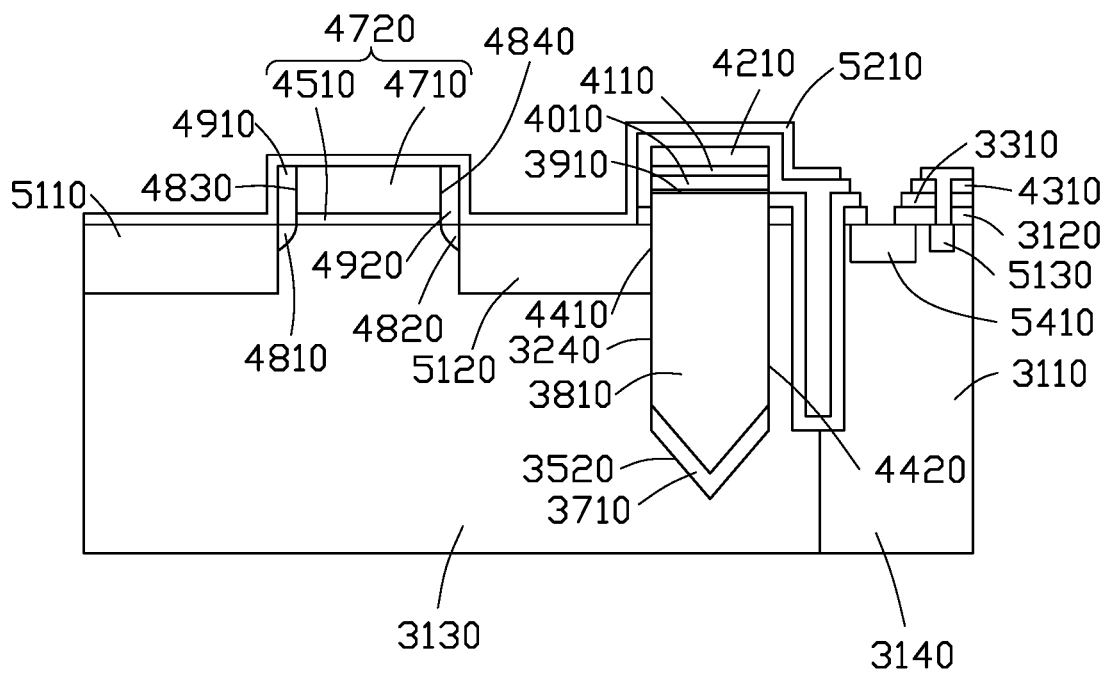

FIG. 54 is a schematic sectional view of another stage in the manufacturing of the optical sensor cell 2910 according to some embodiments of the present disclosure. FIG. 54 illustrates a structure after an intrinsic optical sensor region 5410 of the optical sensor 2970 is formed in the second well region 3130 of the substrate 3110 exposed by the layers 3120, 3310, 4310, 5210. In this exemplary embodiment, the intrinsic optical sensor region 5410 is formed by implanting impurities of the first conductivity type, i.e., p-type dopants, in the second well region 3130 of the substrate 3110 using the protection layer 5210 as a mask. Examples of materials for the p-type dopants include, but are not limited to B, Ga, and Al.

Figure 55:
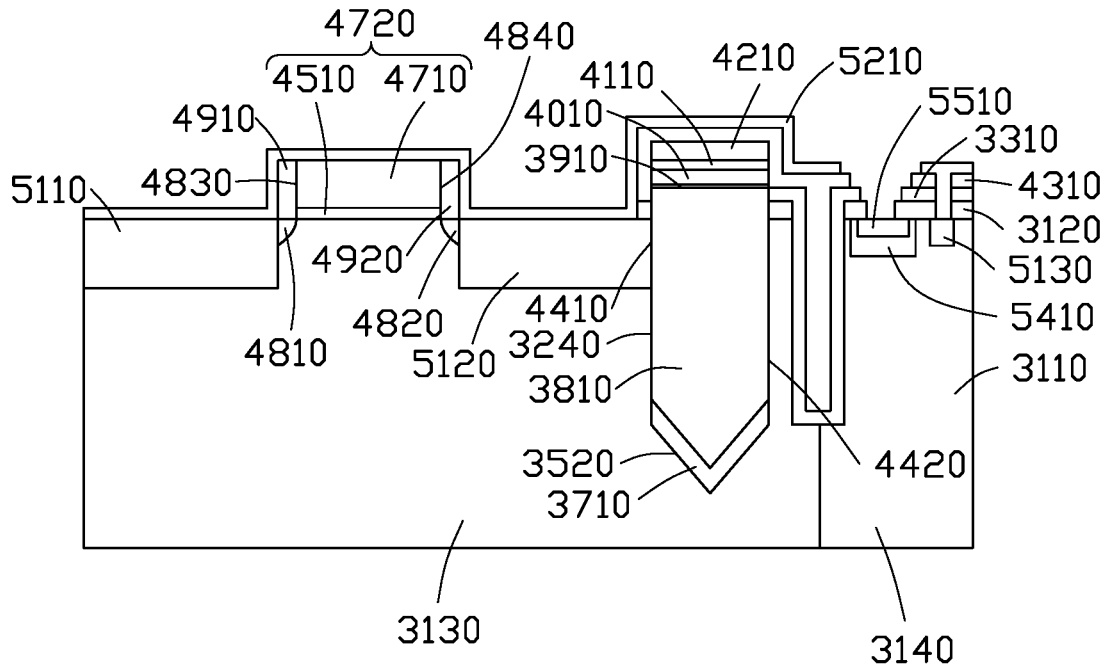

FIG. 55 is a schematic sectional view of another stage in the manufacturing of the optical sensor cell 2910 according to some embodiments of the present disclosure. FIG. 55 illustrates a structure after a second optical sensor region 5510 of the first conductivity type is formed in the intrinsic optical sensor region 5410. In this exemplary embodiment, the second optical sensor region 5510 is formed by implanting impurities of the first conductivity type, i.e., p-type dopants, in the intrinsic optical sensor region 5410 using the protection layer 5210 as a mask. The second optical sensor region 5510 has a greater dopant concentration than the intrinsic optical sensor region 5410. Examples of materials for the p-type dopants include, but are not limited to B, Ga, and Al.

Figure 56:
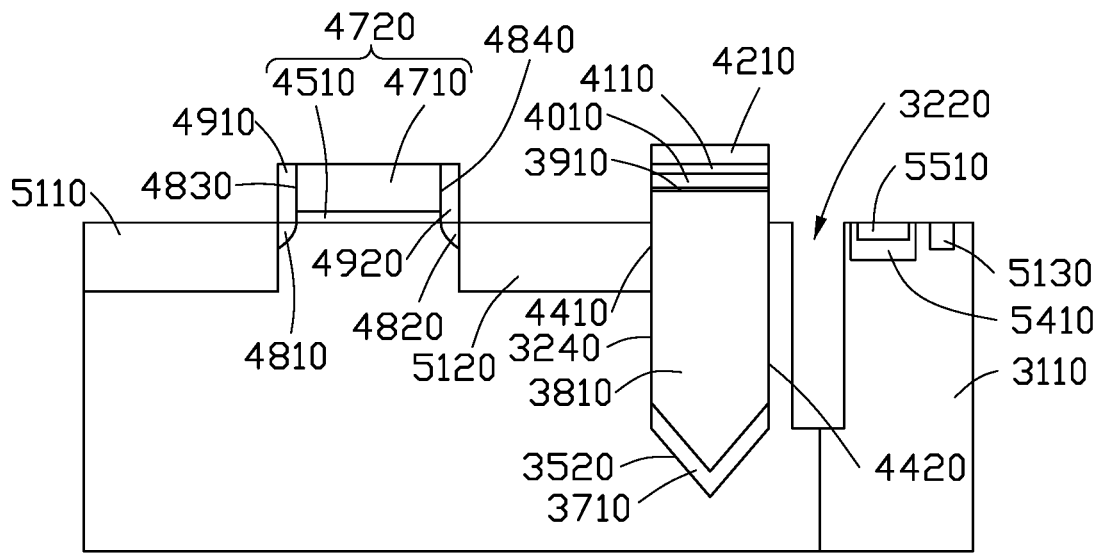

FIG. 56 is a schematic sectional view of another stage in the manufacturing of the optical sensor cell 2910 according to some embodiments of the present disclosure. FIG. 56 illustrates a structure after the layers (labeled 3120, 3310, 4310, 5210 in FIG. 55) are removed, such as by a wet or dry etching process or a combination thereof.

Figure 57:
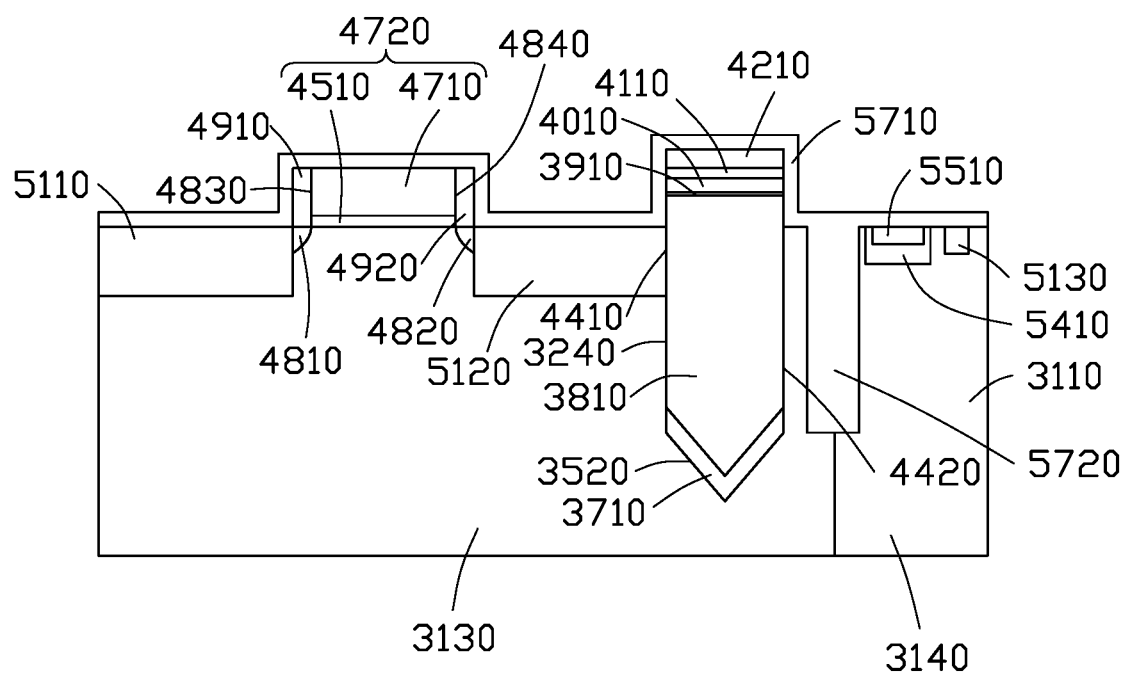

FIG. 57 is a schematic sectional view of another stage in the manufacturing of the optical sensor cell according to some embodiments of the present disclosure. FIG. 57 illustrates a structure after a passivation layer 5710 is formed over the structure of FIG. 56. Examples of materials for the passivation layer 5710 include, but are not limited to, SiO$_2$, SiN, SiON, SiCN, and SiOCN. The passivation 5710 layer may be formed using CVD, PVD, ALD, their derivatives, e.g., PECVD, any suitable deposition technique, or a combination thereof. As shown in FIG. 57, in some embodiments, the second hole (labeled 3220 in FIG. 56) is filled with the passivation layer 5710, forming an isolation region 5720. In other embodiments, the second hole 3220 is partially filled with the passivation layer 5710.

Figure 58:
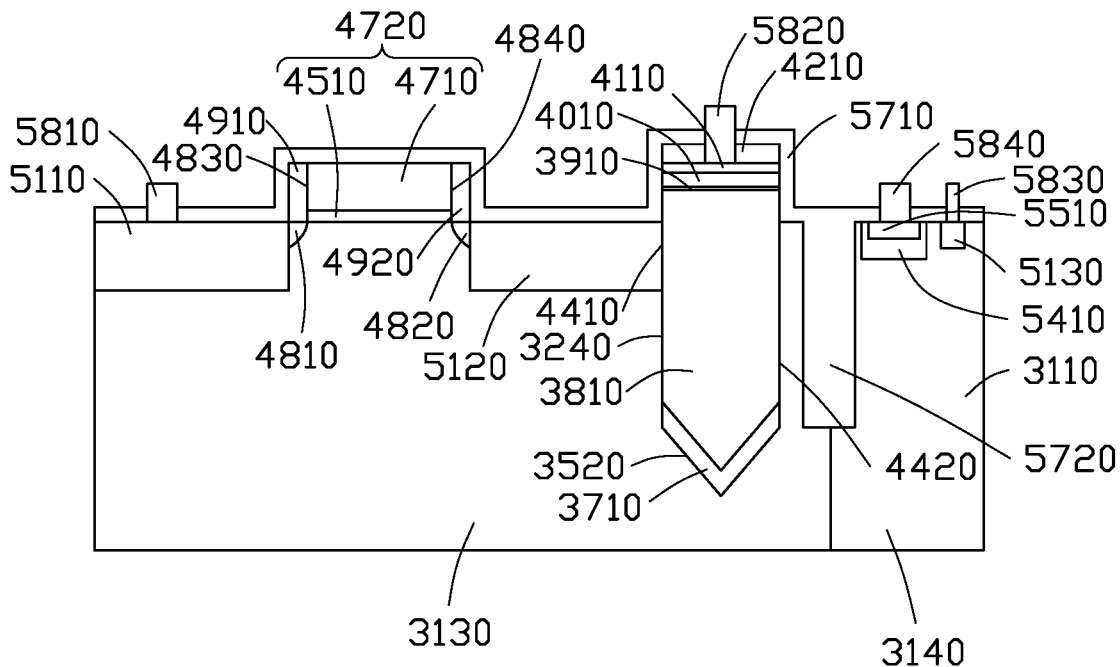

FIG. 58 is a schematic sectional view of another stage in the manufacturing of the optical sensor cell 2910 according to some embodiments of the present disclosure. FIG. 58 illustrates a structure after a source electrode 5810, a light source electrode 5820, and first and second optical sensor electrodes 5830, 5840 are formed over the structure of FIG. 57. As shown in FIG. 58, the source electrode 5810 extends to the source region 5110 through the passivation layer 5710. The light source electrode 5820 extends to the current spreading layer 4110 through the passivation layer 5710 and the light reflecting layer 4210. Each of the first and second optical sensor electrodes 5830, 5840 extends to a respective one of the first and second optical sensor regions 5130, 5410 through the passivation layer 5710.

Examples of materials for the electrodes 5810-5840 include, but are not limited to, Al, Ag, Cu, Au, Cr, Ti, any suitable metal, or an alloy thereof. In some embodiments, the electrodes 5810-5840 are formed using CVD, PVD, ALD, their derivatives, any suitable deposition technique, or a combination thereof.

In an alternative embodiment, the light source electrode 5820 extends to the second light source layer 4010 through the passivation layer 5710, the light reflecting layer 4210, and the current spreading layer 4110.

As illustrated in FIG. 58, the thus formed optical sensor cell 2910 includes a substrate 3110, a light source 2950, a transistor 2960, an optical sensor 2970, an isolation region 5720, and a passivation layer 5710. The substrate 3110 includes a first well region 3130 that has a first conductivity type, e.g., p-type, and a second well region 3140 that has a second conductivity type, e.g., n-type, opposite the first conductivity type. The substrate 3110 may be a semiconductor substrate, such as a bulk semiconductor substrate, a SOI substrate, a multi-layered or gradient substrate, or the like. The substrate 3110 may include a semiconductor material, such as an elemental semiconductor including Si, Ge, a compound or alloy semiconductor including SiGe, SiC, GaAs, GaP, GaAsP, AlInAs, AlGaAs, GaInAs, InAs, GaInP, InP, InSb, GaInAsP, and the like. The substrate 3110 may be doped or undoped. In this exemplary embodiment, the substrate 3110 is a bulk silicon substrate and includes a top surface that has a (100) facet.

The light source 2950, e.g., an LED, a laser, a lamp, a bulb, or any suitable source of light, is formed over the first well region 3130 of the substrate 3110 and includes a buffer layer 3710, first and second light source layers 3810, 4010, a light-generating layer 3910, a current spreading layer 4110, a reflecting layer 4210, and a light source electrode 5820. The buffer layer 3710 is formed in the substrate 3110. The buffer layer 3710 may have a thickness of about 100 nm to about 500 nm, e.g., about 200 nm. Examples of materials for the buffer layer 3710 include, but are not limited to, AlN, GaN, TiN, TaN, HfN, and ZrN.

The first light source layer 3810 extends to the buffer layer 3710 through the top surface of the substrate 3110 and includes lower and upper portions. The lower portion of the first light source layer 3810 has a substantially triangular cross-section, tapers toward a bottom surface of the substrate 3110, and includes opposite inclined surfaces, each of which has a (111) facet. In this exemplary embodiment, the lower portion of the first light source layer 3810 is a hexagonal III-V compound semiconductor, e.g., h-GaN.

The upper portion of the first light source layer 3810 has a substantially rectangular cross-section and includes opposite first and second sidewalls 4410, 4420 substantially perpendicular to the top surface of the substrate 3110. In this exemplary embodiment, upper portion of the first light source layer 3810 is a cubic III-V compound semiconductor, e.g., c-GaN, a top surface of which has a facet, e.g. (100), the same as the facet of the top surface of the substrate 3110.

Although the lower and upper portions of the first light source layer 3810 is exemplified as GaN, the lower and upper portions of the first light source layer 3810 may include InP, InAs, GaAs, InSb, or any suitable alloy of two or more III-V compound semiconductor.

The light-generating layer 3910 is between the first and second light source layers 3810, 4010. In some embodiments, the light-generating layer 3910 covers opposite end portions of the top surface of the first light source layer 3810. In other embodiments, the light-generating layer 3910 covers opposite end portions of the top surface of the first light source layer 3810 and an intermediate portion between the opposite end portions of the top surface of the first light source layer 3810. In such other embodiments, the light-generating layer 3910 may cover the entire top surface of the first light source layer 3810.

In an embodiment, the light-generating layer 3910 includes an SQW. In an alternative embodiment, the light-generating layer 3910 includes an MQW. In such an alternative embodiment, the light-generating layer 3910 may include a plurality of alternating well layers, e.g., GaN, and barrier layers, e.g., AlGaN.

The second light source layer 4010, in some embodiments, covers the opposite end portions of the top surface of the first light source layer 3810. In other embodiments, the second light source layer 4010 covers the opposite end portions and the intermediate portion of the top surface of the first light source layer 3810. In such other embodiments, the second light source layer 4010 may cover the entire top surface of the first light source layer 3810. In this exemplary embodiment, the second light source layer 4010 includes a III-V compound semiconductor. In some embodiments, the second light source layer 4010 include GaN. In other embodiments, the second light source layer 4010 includes InP, InAs, GaAs, InSb, or any suitable alloy of two or more III-V compound semiconductor. The second light source layer 4010 may have a thickness of about 100 nm to about 500 nm, e.g., about 150 nm.

The current spreading layer 4110 is over the second light source layer 4010. In some embodiments, the current spreading layer 4110 covers the opposite end portions of the top surface of the first light source layer 3810. In other embodiments, the current spreading layer 4110 covers the opposite end portions and the intermediate portion of the top surface of the first light source layer 3810. In such other embodiments, the current spreading layer 4110 may cover the entire top surface of the first light source layer 3810.

In this exemplary embodiment, the current spreading layer 4110 includes a TCL. Examples of materials for the TCL include, but are not limited to, Ni, Au, Ag, Pt, and Pd, metal oxides such as IZO, InO, ZnO, ITO, SnO, ATO, SbO, AZO, CTO, and CdO, and metal nitrides such as TiN, WN, and TiWN. The current spreading layer 4110 may have a thickness of about 10 nm to about 100 nm.

The light reflecting layer 4210 is over the current spreading layer 4110 and covers the opposite end portions of the top surface of the first light source layer 3810. The light reflecting layer 4210 is configured to direct light emitted by the light source 2950 through a sidewall of the light source 2950, improving detection of the light by the optical sensor 2970. In some embodiments, the light reflecting layer 4210 is a dielectric mirror, e.g., a distributed Bragg reflector (DBR). In such some embodiments, the light reflecting layer 4210 includes alternating layers of dielectric materials having different refractive indices, e.g., oxides and nitrides. In other embodiments, the light reflecting layer 4210 is a metallic mirror, a crystalline mirror, or a hybrid mirror, i.e., a combination of at least two of the dielectric mirror, the metallic mirror, and the crystalline mirror.

The light source electrode 5820 extends to the current spreading layer 4110 through the light reflecting layer 4210. Examples of materials for the light source electrode 5820 include, but are not limited to, Al, Ag, Cu, Au, Cr, Ti, any suitable metal, or an alloy thereof. In an alternative embodiment, the light source electrode 5820 extends to the second light source layer 4010 through the light reflecting layer 4210 and the current spreading layer 4110. In such an alternative embodiment, the light source electrode 5820 and the current spreading layer 4110 may cover the entire top surface of the first light source layer 3810.

As shown in FIG. 58, while a light source electrode, e.g., light source electrode 5820, is associated with or is connected to the second light source layer 4010, there is no light source electrode associated with or connected to the first light source layer 3810. That is, there is no light source electrode formed on a top surface of the first light source layer 3810 or on a bottom surface of the first light source layer 3810. In other words, the first light source layer 3810 is free of a light source electrode.

The optical sensor 2970, e.g., a photodiode or any suitable sensor that detects light, is formed over the second well region 3140 of the substrate 3110 and includes first and second optical sensor regions 5130, 5510 and an intrinsic optical sensor region 5410, and first and second optical sensor electrodes 5830, 5840. In this exemplary embodiment, the optical sensor 2970 is of a PIN-type structure. For example, the first optical sensor region 5130 is formed in the substrate 3110 and has the second conductivity type, i.e., n-type. As shown in FIG. 58, the first optical sensor region 5130 has a top surface substantially coplanar with the top surface of the substrate 3110. For example, the first optical sensor region 5130 has substantially the same dopant concentration as the source/drain region 5110/5120.

The intrinsic optical sensor region 5410 is formed in the substrate 3110, is between the isolation region 5720 and the first optical sensor region 5130, and has the first conductivity type, i.e., p-type. As shown in FIG. 58, the intrinsic optical sensor region 5410 has a top surface substantially coplanar with the top surface of the substrate 3110. The intrinsic optical sensor region 5410 may have a greater thickness than the first optical sensor region 5410. For example, the intrinsic optical sensor region 5410 has a thickness of about 1 µm to about 5 µm. In certain embodiments, the first optical sensor region 5130 is between the isolation region 5720 and the intrinsic optical sensor region 5410.

The second optical sensor region 5510 is formed in the intrinsic optical sensor region 5410 and has the first conductivity type, i.e., p-type. As shown in FIG. 58, the second optical sensor region 5510 has a top surface substantially coplanar with the top surface of the substrate 3110. The second optical sensor region 5510 may have a substantially the same thickness as the first optical sensor region 5130. For example, the thickness of the first/second optical sensor region 5130 is about 100 nm to about 500. As shown in FIG. 58, the top surface of the first light source layer 3810 is above the top surfaces of the regions 5130, 5410, 5510.

Each of the first and second optical sensor electrodes 5830, 5840 is formed on, i.e., connected to, a respective one of the first and second optical sensor regions 5130, 5410.

In an alternative embodiment, the optical sensor 2970 is of a NIP-type structure. In such an alternative embodiment, the first optical sensor region is formed in a p-type well region and has the first conductivity type, i.e., p-type. The intrinsic optical sensor region is formed in the p-type well region and has the second conductivity type, i.e., n-type. The second optical sensor region is formed in the intrinsic optical sensor region and has the second conductivity type, i.e., n-type.

The transistor 2960 includes a gate structure 4720, spacers 4910, 4920, lightly doped source/drain regions 4810, 4820, source and drain regions 5110, 5120, and a source electrode 5810. The gate structure 4720 includes a gate dielectric 4510 on the top surface of the substrate 3110 and a gate electrode 4710 on a top surface of the gate dielectric 4510. The spacers 4910, 4920 are formed on opposite sidewalls 4830, 4840 of the gate structure 4720, respectively. The lightly doped source/drain regions 4810, 4820 are formed in the substrate 3110 under the spacers 4910, 920, respectively. The source and drain regions 5110, 5120 are adjacent the spacers 4910, 4920, respectively. As shown in FIG. 58, the drain region 5120 is formed on, e.g., connected to or is in contact, with a first sidewall 4410 of the first light source layer 3810.

It is noted that, while the drain region 5120 is connected to or present on the first sidewall 4410 of the first light source layer 3810, the drain region 5120 is absent from a second sidewall 4420 of the first light source layer 3810 opposite the first sidewall 4410 of the first light source layer 3810. In other words, the second sidewall 4420 of the first light source layer 3810 is free of the drain region 5120. That is to say, the drain region 5120 of the transistor 2960 serves as a light source electrode of the first light source layer 3810 of the light source 2950.

In some embodiments, a distance between the second sidewall 4840 of the gate structure 4720 and the first sidewall 4410 of the first light source layer 3810 is less than 50 nm, e.g., 30 nm. In other embodiments, a distance between the second sidewall 4840 of the gate structure 4720 and the first sidewall 4410 of the first light source layer 3810 is less than 20 nm, e.g., 10 nm.

The source electrode 5810 is formed on, i.e., connected to, the source region 5110. As shown in FIG. 58, while a source electrode, e.g., source electrode 5810, is associated with or is connected to the source region 5810, there is no drain electrode associated with or connected to the drain region 5120. That is, there is no drain electrode formed on a top surface of the drain region 5120. In other words, the drain region 5120 is free of a drain electrode.

The isolation region 5720, e.g., an STI region, is between the light source 2950 and the optical sensor 2970 and is configured to electrically isolates the light source 2950 and the optical sensor 2970 from each other. The passivation layer 5710 is formed on the top surface of the source and drain regions 5110, 5120, the top surface of the light source 2950, the top surface of the optical sensor 2970, and surrounds the electrodes 5810-5840. In this exemplary embodiment, the passivation layer 5720 covers the entire top surface of the drain region 5120.

Figure 59:
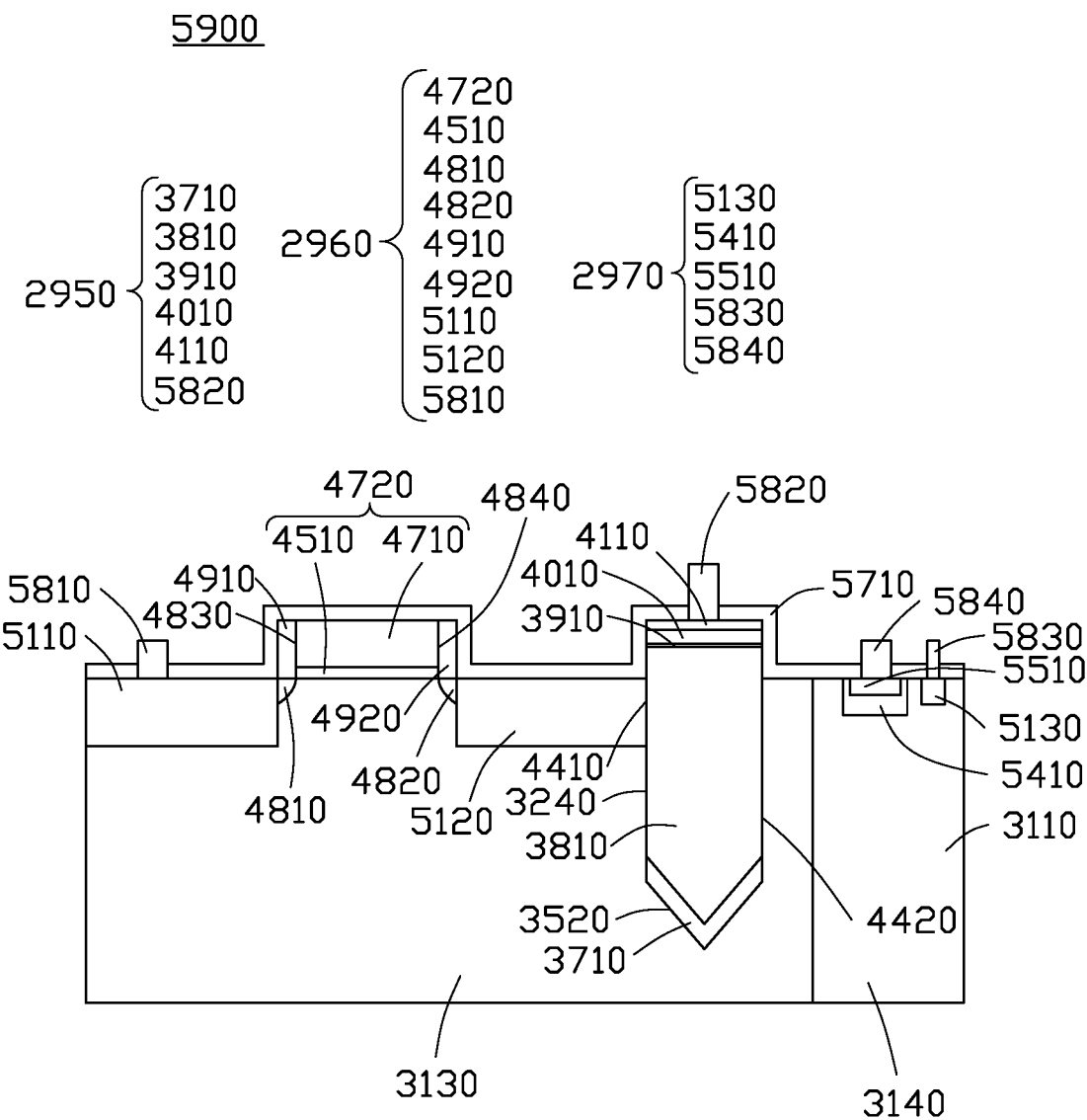
FIGS. 59-61 are schematic sectional views illustrating exemplary optical sensor cells according to some embodiments of the present disclosure.
Figure 60:
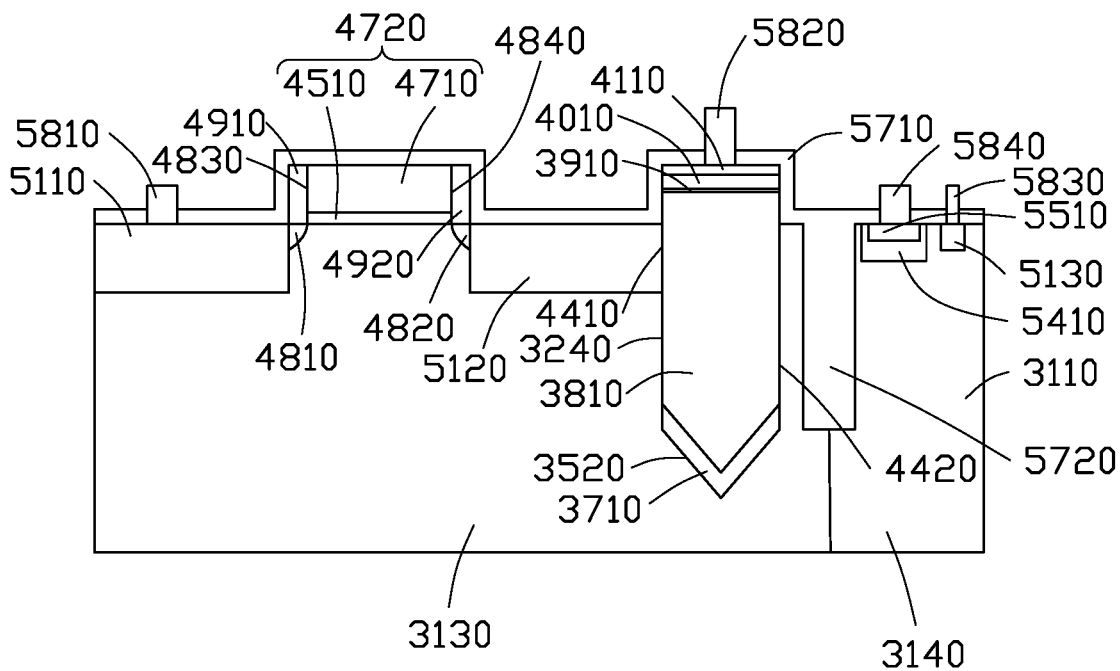
Figure 61:
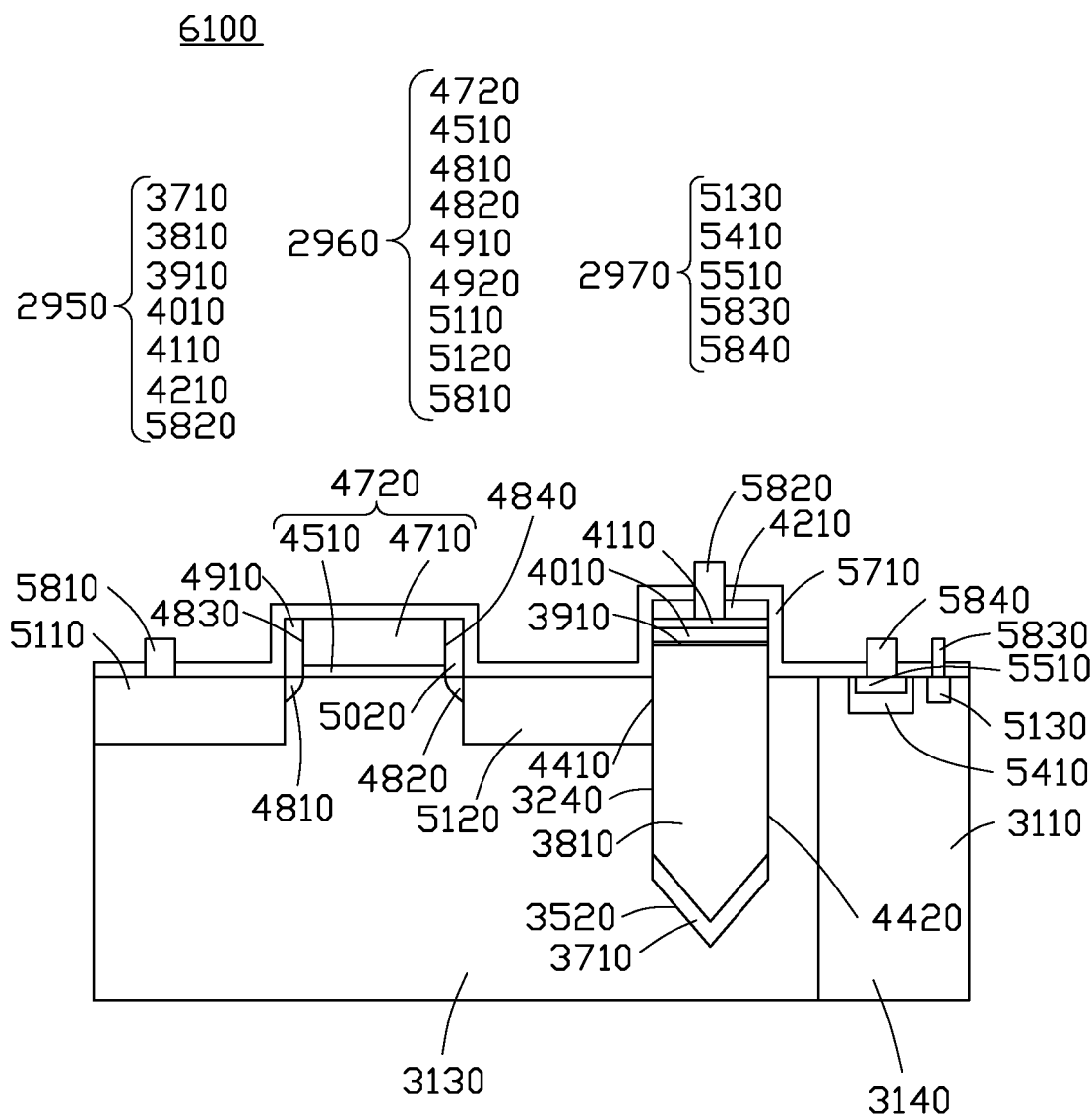

FIGS. 59-61 are schematic sectional views of exemplary optical sensor cells 5900-6100 according to some embodiments of the present disclosure. The optical sensor cell 5900 differs from the optical sensor cell 2910 in that the optical sensor cell 5900 is dispensed with the light reflecting layer (labeled 4210 in FIG. 42) and the isolation region (labeled 5810 in FIG. 58). The optical sensor cell 6000 differs from the optical sensor cell 2910 in that the optical sensor cell 6000 is dispensed with the light reflecting layer 4210. The optical sensor cell 6100 differs from the optical sensor cell 2910 in that the optical sensor cell 6100 is dispensed with the isolation region 5810.

According to an exemplary embodiment of the present disclosure, a light source assembly comprises a plurality of cells and a driving circuit. Each of the cells includes a transistor and a light source. The transistor includes a drain region that serves as a cathode of the light source. The driving circuit is configured to drive the cell.

According to another exemplary embodiment of the present disclosure, an optical sensor cell comprises a transistor, a light source, and an optical sensor. The transistor is over a substrate and includes a drain region. The light source is over the substrate, is coupled to the transistor, and is configured to emit light. The drain region of the transistor serves as a cathode of the light source. The optical sensor is over the substrate and is configured to detect the light.

According to another exemplary embodiment of the present disclosure, a method of manufacturing an optical sensor cell of an optical sensor assembly comprises forming a light source over a substrate and forming an optical sensor over the substrate after forming the light source.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A light source assembly comprising:
   a plurality of cells, each of which including
      a transistor including a drain region, and
      a light source comprising a first light source layer formed in a hole of a substrate, a light-generating layer, and a second light source layer, the first light source layer comprising a first sidewall and a second sidewall opposite to the first sidewall, wherein the drain region of the transistor is in contact with the first sidewall of the first light source layer and not in contact with the second sidewall of the first light source layer, and serves as a cathode of the light source; and
   a driving circuit configured to drive each of the plurality of cells.

2. The light source assembly of claim 1, wherein:
   the transistor further includes a source region and an electrode over the source region; and
   the drain region of the transistor is free of an electrode.

3. An optical sensor cell comprising:
   a transistor over a substrate and including a drain region;
   a light source over the substrate, coupled to the transistor, configured to emit light, wherein the drain region of the transistor serves as a cathode of the light source; and
   an optical sensor over the substrate and configured to detect the light,
   wherein the substrate includes a first well region and a second well region that has a different conductivity type than the first well region,
   the transistor is over the first well region of the substrate, and
   the optical sensor is over the second well region of the substrate.

4. The optical sensor cell of claim 3, wherein:
   the light source is over the first well region of the substrate.

5. The optical sensor cell of claim 3, wherein the light source is between the transistor and the optical sensor.

6. The optical sensor cell of claim 3, wherein the optical sensor includes
   a first optical sensor region, and
   a second optical sensor region having a different conductivity type than the first optical sensor region and disposed between the light source and the first optical sensor region.

7. The optical sensor cell of claim 6, wherein the optical sensor further includes an intrinsic optical sensor region over the substrate and the second optical sensor region is in the intrinsic optical sensor region.

8. The optical sensor cell of claim 3, wherein:
   the optical sensor includes a first optical sensor region and a second optical sensor region that has a different conductivity type than the first optical sensor region; and
   at least one of the first and second optical sensor regions has a top surface substantially coplanar with a top surface of the substrate.

9. The optical sensor cell of claim 3, further comprising an isolation region over the substrate and between the light source and the optical sensor.

10. The optical sensor cell of claim 3, further comprising a light reflecting layer over a top surface of the light source.

11. The optical sensor cell of claim 3, wherein the light source includes a light source layer, the optical sensor includes an optical sensor region, and a top surface of the light source layer is above a top surface of the optical sensor region.

12. The optical sensor cell of claim 3, wherein the transistor includes a source/drain region and the optical sensor includes an optical sensor region that has a substantially same dopant concentration as the source/drain region.

13. A method comprising:
    simultaneously forming first and second holes in a substrate;
    growing a III-V compound semiconductor in the first hole and forming a light source over the substrate; and
    depositing a dielectric material in the second hole and forming an optical sensor over the substrate after forming the light source.

14. The method of claim 13, further comprising forming a light reflecting layer over the light source.

15. The method of claim 13, further comprising:
    forming a first optical sensor region of the optical sensor over the substrate; and
    forming an intrinsic optical sensor region of the optical sensor such that the intrinsic optical sensor region is between the light source and the first optical sensor region.

16. The method of claim 13, further comprising:
    forming an intrinsic optical sensor region of the optical sensor over the substrate; and
    forming an isolation region between the light source and the intrinsic optical sensor region.

\* \* \* \* \*